US012804814B2

(12) United States Patent
Ortiz et al.

(10) Patent No.: US 12,804,814 B2
(45) Date of Patent: Nov. 17, 2026

(54) FORMING WELDED AND SOLDERED CONNECTIONS TO FLEXIBLE INTERCONNECT CIRCUITS

(71) Applicant: CelLink Corporation, San Carlos, CA (US)

(72) Inventors: Jean-Paul Ortiz, White Lake, MI (US); Michael Nguyen, San Jose, CA (US); Malcolm Parker Brown, San Francisco, CA (US); Kevin Michael Coakley, Belmont, CA (US); Robin Gorrell, Georgetown, TX (US); Theodore Matthew Urdea, Novi, MI (US); Shawn D'Gama, Farmington Hills, MI (US)

(73) Assignee: CelLink Corporation, Redwood City, CA (US)

( * ) Notice: Subject to any disclaimer, the term of this patent is extended or adjusted under 35 U.S.C. 154(b) by 265 days.

(21) Appl. No.: 18/771,755

(22) Filed: Jul. 12, 2024

(65) Prior Publication Data

US 2025/0024605 A1 Jan. 16, 2025

Related U.S. Application Data

(60) Provisional application No. 63/646,217, filed on May 13, 2024, provisional application No. 63/513,634, filed on Jul. 14, 2023.

(51) Int. Cl.

*H05K 1/11* (2006.01)
*H05K 1/181* (2026.01)
*H05K 3/328* (2026.01)

(52) U.S. Cl.

CPC .............. *H05K 1/118* (2013.01); *H05K 1/111* (2013.01); *H05K 1/181* (2013.01); *H05K 3/328* (2013.01)

(58) Field of Classification Search

None
See application file for complete search history.

(56) References Cited

U.S. PATENT DOCUMENTS

| | | | |
|---|---|---|---|
| 3,750,278 | A | 8/1973 | Oberg et al. |
| 4,818,840 | A | 4/1989 | Booth et al. |

(Continued)

FOREIGN PATENT DOCUMENTS

| | | | |
|---|---|---|---|
| CN | 203715762 U | 7/2014 | |
| EP | 3496180 A1 | 6/2019 | |

(Continued)

OTHER PUBLICATIONS

Nagarajan Palavesam et al; "Roll-to-roll processing of film substrates for hybrid integrated flexible electronics" Flexible and Printed Electronics, Feb. 2018.

*Primary Examiner* — Timothy J Thompson
*Assistant Examiner* — John B Freal
(74) *Attorney, Agent, or Firm* — Polygon IP, LLP

(57) ABSTRACT

Described herein are methods for forming welded and soldered connections to flexible interconnect circuits and assemblies comprising such connections. An assembly can include a weldable transition unit having a transition pad and a solderable pad. The transition pad may comprise aluminum and can be welded to the aluminum conductive trace of a flexible interconnect circuit. The solderable pad can be soldered to the electrical contact of a device (e.g., a resistor, capacitor). In some examples, the weldable transition unit may comprise a stiffener mechanically connected to the transition pad to provide mechanical support of the transition pad and devices soldered to the transition pad. In some examples, the device soldered to the weldable transition unit may include one or more individual electronic components. In some examples, the device soldered to the weldable (Continued)

transition unit may be a printed circuit board (PCB) having solderable traces.

18 Claims, 20 Drawing Sheets

(56) References Cited

U.S. PATENT DOCUMENTS

| | | | |
|---|---|---|---|
| 5,262,594 | A | 11/1993 | Edwin et al. |
| 5,645,932 | A | 7/1997 | Uchibori |
| 6,010,771 | A | 1/2000 | Isen et al. |
| 6,036,809 | A | 3/2000 | Kelly et al. |
| 6,332,909 | B1 | 12/2001 | Teshima et al. |
| 6,787,732 | B1 | 9/2004 | Xuan et al. |
| 6,881,923 | B2 | 4/2005 | Battaglia |
| 6,992,001 | B1 | 1/2006 | Lin |
| 7,497,004 | B2 | 3/2009 | Cote et al. |
| 7,633,035 | B2 | 12/2009 | Kirmeier |
| 7,714,931 | B2 * | 5/2010 | Singh .................... H04N 23/54 348/374 |
| 8,510,934 | B2 | 8/2013 | Brand et al. |
| 8,931,166 | B2 | 1/2015 | Marttila |
| 9,214,607 | B1 | 12/2015 | Andrews |
| 9,671,352 | B2 | 6/2017 | Woo et al. |
| 9,692,030 | B2 | 6/2017 | Schüssler et al. |
| 9,730,333 | B2 | 8/2017 | Li et al. |
| 10,008,403 | B2 | 6/2018 | Rumsby et al. |
| 10,842,025 | B1 | 11/2020 | Lane |
| 2001/0001505 | A1 * | 5/2001 | Schueller .............. H05K 1/114 257/692 |
| 2001/0006766 | A1 | 7/2001 | O'Brien et al. |
| 2002/0046856 | A1 | 4/2002 | Alcoe |
| 2002/0050489 | A1 | 5/2002 | Ikegami et al. |
| 2003/0062347 | A1 | 4/2003 | Song et al. |
| 2006/0032665 | A1 | 2/2006 | Ice |
| 2007/0171129 | A1 | 7/2007 | Coleman et al. |
| 2007/0193027 | A1 | 8/2007 | Takakusaki et al. |
| 2008/0017971 | A1 | 1/2008 | Hollis |
| 2008/0083715 | A1 | 4/2008 | Kirmeier |
| 2008/0128397 | A1 | 6/2008 | Gandhi |
| 2009/0007421 | A1 | 1/2009 | Chen et al. |
| 2010/0031996 | A1 | 2/2010 | Basol |
| 2011/0001670 | A1 | 1/2011 | Coleman et al. |
| 2011/0089212 | A1 | 4/2011 | Schmid et al. |
| 2012/0164490 | A1 | 6/2012 | Itoi et al. |
| 2012/0171527 | A1 | 7/2012 | Hiroma |
| 2012/0227907 | A1 | 9/2012 | Arakawa et al. |
| 2013/0055555 | A1 | 3/2013 | Forster et al. |
| 2013/0260191 | A1 | 10/2013 | Takahashi et al. |
| 2014/0268780 | A1 | 9/2014 | Wang et al. |
| 2015/0023584 | A1 | 1/2015 | Rudin |
| 2015/0228956 | A1 | 8/2015 | Schüssler et al. |
| 2015/0270190 | A1 | 9/2015 | Kim et al. |
| 2015/0334859 | A1 * | 11/2015 | Lee ........................ G06F 21/32 361/679.01 |
| 2016/0181579 | A1 | 6/2016 | Geshi et al. |
| 2016/0207287 | A1 | 7/2016 | Kim |
| 2016/0315304 | A1 | 10/2016 | Biskup |
| 2016/0366768 | A1 | 12/2016 | Matsuda |
| 2017/0012331 | A1 | 1/2017 | Ng et al. |
| 2017/0214033 | A1 | 7/2017 | Takano et al. |
| 2018/0034023 | A1 | 2/2018 | Newman et al. |
| 2018/0205048 | A1 | 7/2018 | Enomoto et al. |
| 2018/0294536 | A1 | 10/2018 | Kruszelnicki |
| 2019/0097204 | A1 | 3/2019 | Liposky et al. |
| 2019/0181419 | A1 | 6/2019 | Suba et al. |
| 2019/0296281 | A1 | 9/2019 | Elsberry |
| 2019/0312251 | A1 | 10/2019 | Matthews |
| 2019/0341585 | A1 | 11/2019 | Shi et al. |
| 2020/0220120 | A1 | 7/2020 | Day et al. |
| 2021/0066683 | A1 | 3/2021 | Lane |
| 2021/0086306 | A1 | 3/2021 | Lane |
| 2021/0091363 | A1 | 3/2021 | Lane |
| 2021/0092837 | A1 | 3/2021 | Lane |
| 2021/0092851 | A1 | 3/2021 | Lane |
| 2021/0092853 | A1 | 3/2021 | Lane |
| 2021/0092854 | A1 | 3/2021 | Lane |

FOREIGN PATENT DOCUMENTS

| | | | |
|---|---|---|---|
| KR | 20150058939 | A | 5/2015 |
| WO | 2019150740 | A1 | 8/2019 |

* cited by examiner

Device
Installation

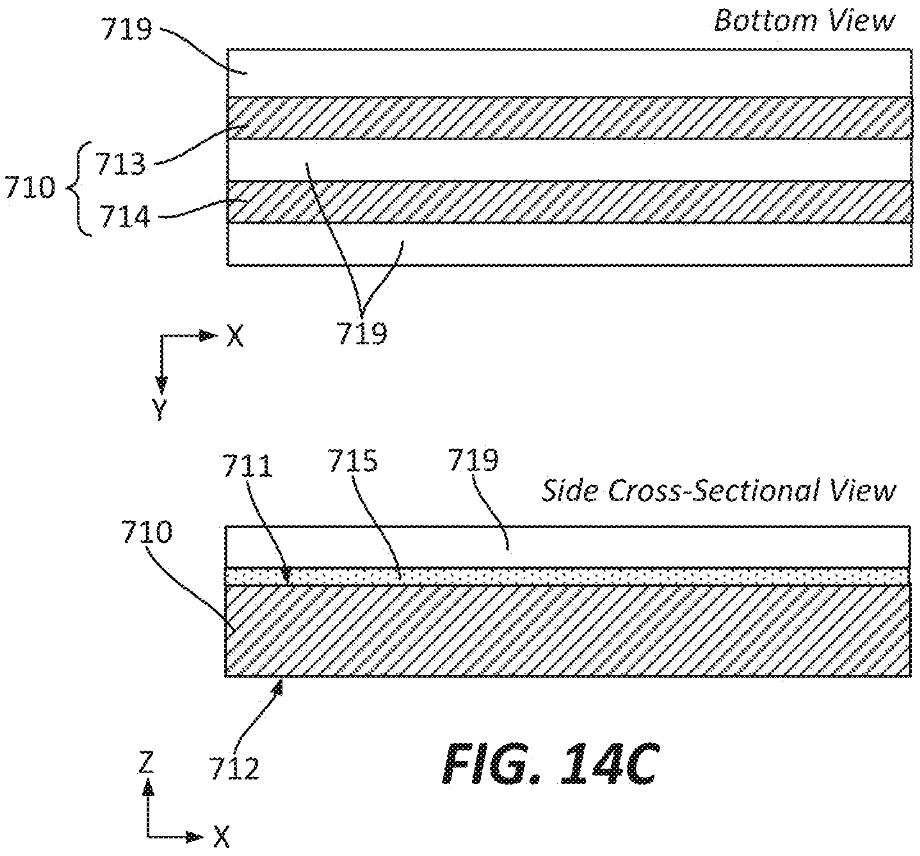
FIG. 14C
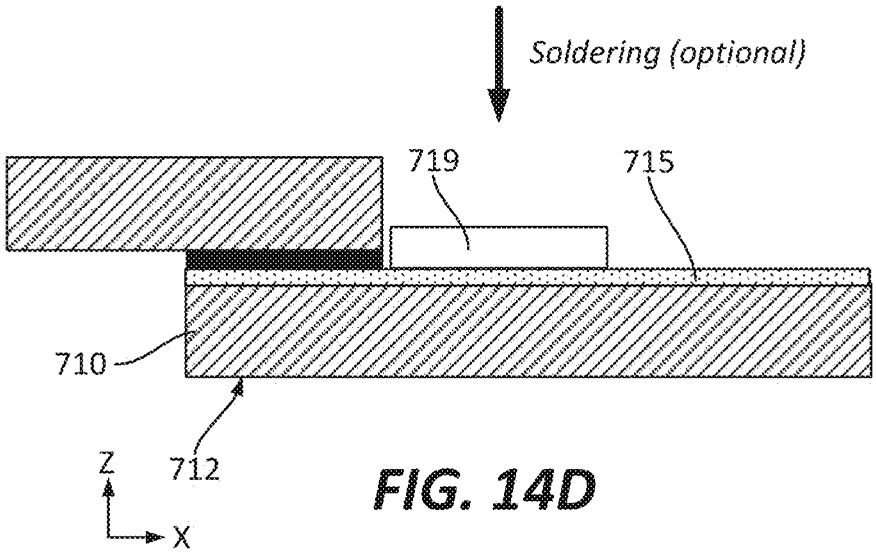
FIG. 14D

FORMING WELDED AND SOLDERED CONNECTIONS TO FLEXIBLE INTERCONNECT CIRCUITS

CROSS-REFERENCE TO RELATED APPLICATIONS

This application claims the benefit under 35 U.S.C. § 119(e) of U.S. Provisional Patent Application 63/513,634 by Jean-Paul Ortiz, et al., entitled: "Forming Welded and Soldered Connections to Flexible Interconnect Circuits", filed on Jul. 14, 2023, and U.S. Provisional Patent Application 63/646,217 by Theodore Matthew Urdea, et al., entitled: "Forming Welded and Soldered Connections to Flexible Interconnect Circuits", filed on May 13, 2024, all of which are incorporated herein by reference in their entirety for all purposes.

SUMMARY

Described herein are methods for forming welded and soldered connections to flexible interconnect circuits and assemblies comprising such connections. An assembly can include a weldable transition unit having a transition pad and a solderable pad. The transition pad may comprise aluminum and can be welded to the aluminum conductive trace of a flexible interconnect circuit. The solderable pad can be soldered to the electrical contact of a device (e.g., a resistor, capacitor). In some examples, the weldable transition unit may comprise a stiffener mechanically connected to the transition pad to provide mechanical support of the transition pad and devices soldered to the transition pad. In some examples, the device soldered to the weldable transition unit may include one or more individual electronic components. In some examples, the device soldered to the weldable transition unit may be a printed circuit board (PCB) having solderable traces.

In some aspects, the techniques described herein relate to an assembly including: a flexible interconnect circuit defining a plane and including a conductive trace including a conductive material; a weldable transition unit welded to the conductive trace, forming a weld, and including a transition pad; a surface mount device electronically and mechanically coupled with the transition pad; and a stiffener formed from a different material than the transition pad and directly interfacing the transition pad and including an opening aligned with the surface mount device.

In some aspects, the techniques described herein relate to an assembly, wherein: the transition pad has a thickness in a direction perpendicular to the plane of the flexible interconnect circuit, the conductive trace has a thickness in the direction perpendicular to the plane of the flexible interconnect circuit, and the thickness of the transition pad and the thickness of the conductive trace differ by less than 30%.

In some aspects, the techniques described herein relate to an assembly, wherein the stiffener has a thickness in a direction perpendicular to the plane of the flexible interconnect circuit of 1.5-2 millimeters.

In some aspects, the techniques described herein relate to an assembly, wherein the transition pad and the conductive trace have a substantially similar composition.

In some aspects, the techniques described herein relate to an assembly, wherein the conductive material of the conductive trace is aluminum.

In some aspects, the techniques described herein relate to an assembly, wherein the transition pad directly interfaces the conductive trace.

In some aspects, the techniques described herein relate to an assembly, further including a thermally conductive adhesive pad interfacing the stiffener such that the stiffener is positioned between the thermally conductive adhesive pad and the transition pad.

In some aspects, the techniques described herein relate to an assembly, wherein the thermally conductive adhesive pad includes a thermally conductive pressure sensitive adhesive.

In some aspects, the techniques described herein relate to an assembly, further including a thermally conductive filler positioned within the opening and thermally coupled with both the thermally conductive adhesive pad and the surface mount device.

In some aspects, the techniques described herein relate to an assembly, wherein the thermally conductive filler includes a thermally conductive epoxy.

In some aspects, the techniques described herein relate to an assembly, further including a transition adhesive pad positioned between and physically coupling the transition pad and the stiffener.

In some aspects, the techniques described herein relate to an assembly, wherein the transition pad includes two layers formed from different conductive materials selected from the group consisting of aluminum, nickel, copper, tin, silver, nickel, platinum, gold, and brass.

In some aspects, the techniques described herein relate to an assembly, wherein the transition pad is at least partially coated with a layer including tin.

In some aspects, the techniques described herein relate to an assembly, wherein the surface mount device is selected from the group consisting of a resistor, a capacitor, a diode, a transistor, an inductor, a transformer, an optoelectronic device, a sensor, a switch, an oscillator, a negative temperature coefficient (NTC) thermistor, an integrated circuit, a printed circuit board (PCB), another flexible interconnect circuit, and a power supply.

In some aspects, the techniques described herein relate to an assembly, wherein the weld is one of a laser weld and an ultrasonic weld.

In some aspects, the techniques described herein relate to an assembly, wherein: the flexible interconnect circuit further includes a first insulating layer and a second insulating layer such that the conductive trace at least partially extends between and adheres to the first insulating layer and the second insulating layer, and a portion of the conductive trace, forming the weld, extends past the first insulating layer and overlaps with the second insulating layer.

In some aspects, the techniques described herein relate to an assembly, wherein: the assembly further includes an additional conductive trace including a conductive material; the weldable transition unit further includes an additional surface mount device and an additional transition pad including a conductive material and affixed to the flexible interconnect circuit and electronically coupled with the additional conductive trace via an additional weld; and the stiffener further includes an additional opening aligned with the additional surface mount device.

In some aspects, the techniques described herein relate to an assembly, wherein the additional transition pad is at least partially coated with a layer of a material including tin.

In some aspects, the techniques described herein relate to a method for fabricating an assembly, the method including: providing a transition pad and an additional transition pad; affixing a transition adhesive pad to the transition pad and an additional transition adhesive pad to the additional transition pad; providing a surface mount device; soldering the surface mount device to both the transition pad and the additional transition pad, thereby electrically and mechanically connecting the surface mount device to both the transition pad and the additional transition pad; positioning a stiffener including an opening on the transition adhesive pad and the additional transition adhesive pad such that the surface mount device is positioned within the opening, thereby mechanically coupling the stiffener with the transition pad and the additional transition pad; positioning a thermally conductive filler within the opening such that the thermally conductive filler is in thermal contact with the surface mount device; applying a thermally conductive adhesive pad to a side of the stiffener opposite the transition pad such that the thermally conductive adhesive pad is thermally coupled with the thermally conductive filler; providing a flexible interconnect circuit including a conductive trace; and welding the transition pad to the conductive trace forming a weld such that the weld mechanically and electrically interconnects the transition pad and the conductive trace.

In some aspects, the techniques described herein relate to a method, wherein the soldering is by reflow soldering.

In some aspects, the techniques described herein relate to a method, wherein the transition pad and the additional transition pad are each formed from aluminum.

In some aspects, the techniques described herein relate to a method, wherein both the transition pad and additional transition pad are at least partially coated with a layer of material including tin.

In some aspects, the techniques described herein relate to a method, further including affixing the thermally conductive adhesive pad to a battery cell, thereby thermally interconnecting the surface mount device with the battery cell via the thermally conductive adhesive pad and the thermally conductive filler.

In some aspects, the techniques described herein relate to an assembly including: a flexible interconnect circuit having a plane and including a conductive trace including a conductive material; a weldable transition unit including a transition pad formed from the conductive material, a first solderable pad, and a second solderable pad, wherein: the transition pad has a first transition pad side and a second transition pad side opposite the first transition pad side, the first transition pad side directly interfaces the conductive trace, the transition pad is welded to the conductive trace forming a weld, the first solderable pad and the second solderable pad each are formed from a material having a different composition than the transition pad, and the first solderable pad and the second solderable pad each directly interface and are mechanically coupled with the second transition pad side and the second solderable pad does not interface the first solderable pad, a printed circuit board including an insulating layer directly interfacing a solderable trace; and a solder patch disposed between the solderable trace and each of the first solderable pad and the second solderable pad, wherein the solder patch electrically and mechanically interconnects the solderable trace with each of the first solderable pad and the second solderable pad.

In some aspects, the techniques described herein relate to an assembly, wherein: the weldable transition unit has a transition pad axis intersecting both the first solderable pad and the second solderable pad and in a plane parallel with the plane of the flexible interconnect circuit, the solderable trace has a solderable trace axis in a plane parallel with the plane of the flexible interconnect circuit, and the transition pad axis is substantially parallel with the solderable trace axis.

In some aspects, the techniques described herein relate to an assembly, wherein the transition pad has a length measured in a direction parallel with the transition pad axis, a width measured in a plane parallel with the plane of the flexible interconnect circuit and orthogonal to the direction the length is measured in, and an aspect ratio which is a ratio of the width to the length, and the aspect ratio is less than 0.2.

In some aspects, the techniques described herein relate to an assembly, wherein the first solderable pad and the second solderable pad are separated by a distance measured in a direction parallel with the plane of the flexible interconnect circuit of greater than or equal to 2 millimeters.

In some aspects, the techniques described herein relate to an assembly, further including a first insulating layer and a second insulating layer, wherein: the first insulating layer and the second insulating layer are positioned such that the conductive trace at least partially extends between the first insulating layer and the second insulating layer, the conductive trace is adhered to the first insulating layer and the second insulating layer, and a portion of the conductive trace, forming the weld with the weldable transition unit, extends past the first insulating layer and overlaps with the second insulating layer.

In some aspects, the techniques described herein relate to an assembly, wherein the transition pad and the conductive trace have a substantially similar composition.

In some aspects, the techniques described herein relate to an assembly, wherein the conductive material of the conductive trace is aluminum.

In some aspects, the techniques described herein relate to an assembly, wherein the first solderable pad has a thickness of 10-30 micrometers measured perpendicular to the plane of the flexible interconnect circuit.

In some aspects, the techniques described herein relate to an assembly, wherein the transition pad has a thickness of 50-70 micrometers measured perpendicular to the plane of the flexible interconnect circuit.

In some aspects, the techniques described herein relate to an assembly, wherein the first solderable pad and the second solderable pad are each formed from a material selected from the group consisting of nickel, copper, tin, silver, nickel, platinum, gold, and brass.

In some aspects, the techniques described herein relate to an assembly, wherein the transition pad is at least partially coated with a layer of a material including tin.

In some aspects, the techniques described herein relate to an assembly, wherein the weld is one of a laser weld and an ultrasonic weld.

In some aspects, the techniques described herein relate to an assembly, wherein: the flexible interconnect circuit further includes a first insulating layer and a second insulating layer such that the conductive trace at least partially extends between and is adhered to the first insulating layer and the second insulating layer, and a portion of the conductive trace, forming the weld with the weldable transition unit, extends past the first insulating layer and overlaps with the second insulating layer.

In some aspects, the techniques described herein relate to an assembly, wherein: the flexible interconnect circuit further includes an additional conductive trace including a conductive material, the printed circuit board further includes an additional solderable trace directly interfacing the insulating layer, the assembly further includes an additional weldable transition unit including an additional transition pad, a third solderable pad, a fourth solderable pad, and an additional solder patch, the additional transition pad has a third transition pad side and a fourth transition pad side opposite the third transition pad side, the additional transition pad is welded to the additional conductive trace forming an additional weld, the third solderable pad and the fourth solderable pad are each formed from a material having a different composition than the additional transition pad, the third solderable pad and the fourth solderable pad each directly interface the fourth transition pad side and the fourth solderable pad does not interface the third solderable pad, and the additional solder patch is disposed between the additional solderable trace and each of the third solderable pad and the fourth solderable pad, thereby electrically and mechanically interconnecting the additional solderable trace with each of the third solderable pad and the fourth solderable pad.

In some aspects, the techniques described herein relate to an assembly, wherein the additional transition pad and the additional conductive trace have a substantially similar composition as.

In some aspects, the techniques described herein relate to a method for fabricating an assembly, the method including: providing a weldable transition unit including a transition pad formed from a conductive material, a first solderable pad, and a second solderable pad, wherein: the transition pad has a first transition pad side having a plane and a second transition pad side opposite the first transition pad side, the first solderable pad and the second solderable pad each directly interface and are mechanically coupled with the second transition pad side, the first solderable pad does not interface the second solderable pad, and the transition pad has a transition pad axis intersecting both the first solderable pad and the second solderable pad; providing a printed circuit board having a plane and including a solderable trace having a solderable trace axis in a plane parallel with the plane of the printed circuit board; soldering the solderable trace to both the first solderable pad and the second solderable pad, thereby electrically and mechanically coupling the printed circuit board with the weldable transition unit and aligning the transition pad axis with the solderable trace axis; providing a flexible interconnect circuit including a conductive trace including a conductive material; aligning the flexible interconnect circuit with the weldable transition unit; and welding the weldable transition unit to the conductive trace such that first transition pad side interfaces the conductive trace, thereby electrically and mechanically coupling the weldable transition unit with the conductive trace.

In some aspects, the techniques described herein relate to a method, wherein first solderable pad and the second solderable pad are separated by a distance measured in a direction parallel with the transition pad axis of greater than or equal to 2 millimeters.

In some aspects, the techniques described herein relate to a method, wherein the transition pad has a length measured in a direction parallel with the transition pad axis, a width measured in a plane parallel with the plane of the first transition pad side and orthogonal to the direction the length is measured in, and an aspect ratio which is a ratio of the width to the length, and the aspect ratio is less than 0.9.

In some aspects, the techniques described herein relate to a method, wherein both the conductive trace and the transition pad are formed from aluminum.

In some aspects, the techniques described herein relate to a method, wherein the welding is by one of laser welding and ultrasonic welding.

In some aspects, the techniques described herein relate to a method, wherein the first solderable pad and the second solderable pad are both formed from a different material than the transition pad.

In some aspects, the techniques described herein relate to a method, wherein the first solderable pad and the second solderable pad are each formed from a material selected from the group consisting of nickel, copper, tin, silver, nickel, platinum, gold, and brass.

In some aspects, the techniques described herein relate to an assembly including: a flexible interconnect circuit including a conductive trace and an additional conductive trace, wherein the conductive trace and the both include aluminum; an interface unit including an interface-unit solderable layer and an interface-unit base including aluminum and welded to the conductive trace forming a weld; an additional interface unit including an additional interface-unit solderable layer and an additional interface-unit base including aluminum and welded to the additional conductive trace forming an additional weld; a device including a device base, a contact pad, and an additional contact pad, wherein contact pad and additional contact pad both include copper; a solder patch disposed between the contact pad and the interface-unit solderable layer, wherein the solder patch mechanically and electrically interconnects the contact pad and the interface-unit solderable layer; and an additional solder patch disposed between the additional contact pad and the additional interface-unit solderable layer, wherein the additional solder patch mechanically and electrically interconnects the additional contact pad and the additional interface-unit solderable layer.

In some aspects, the techniques described herein relate to an assembly, wherein the interface-unit base and the conductive trace directly interface each other.

In some aspects, the techniques described herein relate to an assembly, wherein the interface-unit solderable layer is positioned away from the weld.

In some aspects, the techniques described herein relate to an assembly, wherein the interface-unit solderable layer partially extends over a surface of the interface-unit base facing away from the conductive trace.

In some aspects, the techniques described herein relate to an assembly, wherein the interface-unit base and the conductive trace have thicknesses that differ less than 50%.

In some aspects, the techniques described herein relate to an assembly, wherein the weld is one of a laser weld and an ultrasonic weld.

In some aspects, the techniques described herein relate to an assembly, wherein the interface-unit solderable layer includes one or more materials selected from the group consisting of nickel, copper, tin, silver, nickel, platinum, gold, and brass.

In some aspects, the techniques described herein relate to an assembly, wherein the device is selected from the group consisting of a resistor, a capacitor, a diode, a transistor, an inductor, a transformer, an optoelectronic device, a sensor, a switch, an oscillator, a negative temperature coefficient (NTC) thermistor, an integrated circuit, a printed circuit board (PCB), another flexible interconnect circuit, and a power supply.

In some aspects, the techniques described herein relate to an assembly, wherein: the flexible interconnect circuit further includes a first insulating layer and a second insulating layer such that the conductive trace at least partially extends between and adhered to the first insulating layer and the second insulating layer, and a portion of the conductive trace, forming the weld with the interface-unit base, extends past the first insulating layer and overlaps with the second insulating layer.

In some aspects, the techniques described herein relate to an assembly, wherein the additional conductive trace is a part of the flexible interconnect circuit.

In some aspects, the techniques described herein relate to an assembly, wherein: the flexible interconnect circuit further includes a first insulating layer and a second insulating layer such that the conductive trace at least partially extends between and adhered to the first insulating layer and the second insulating layer, and the additional conductive trace at least partially extends between and adhered to the first insulating layer and the second insulating layer.

In some aspects, the techniques described herein relate to an assembly, wherein: the first insulating layer has a first-insulator-layer opening exposing a portion of the conductive trace, forming the weld with the interface-unit base, and a portion of the additional conductive trace, forming the additional weld with the additional interface-unit base, and the interface-unit base and the additional interface-unit base at least partially extend into the first-insulator-layer opening.

In some aspects, the techniques described herein relate to an assembly, wherein the second insulating layer has a second-insulator-layer opening at least partially exposing the interface-unit base and the additional interface-unit base.

In some aspects, the techniques described herein relate to an assembly, wherein a portion of the second insulating layer overlapping with the first-insulator-layer opening is continuous and opening-free.

In some aspects, the techniques described herein relate to a method of fabricating an assembly, the method including: providing an interface unit including an interface-unit solderable layer and an interface-unit base including aluminum; providing a device including a device base and a contact pad including copper; soldering the contact pad to the interface-unit solderable layer thereby forming a solder patch such that the solder patch mechanically and electrically interconnects the contact pad and the interface-unit solderable layer; providing a flexible interconnect circuit including a conductive trace including aluminum; and welding the interface-unit base to the conductive trace forming a weld such that the weld mechanically and electrically interconnects the interface-unit base and the conductive trace.

In some aspects, the techniques described herein relate to a method, wherein: the interface unit is provided as a part of an interface-unit assembly including additional interface units temporarily interconnected with each other, the device is provided as a part of a device assembly including additional devices temporarily interconnected with each other, and the contact pad is soldered to the interface-unit solderable layer while the interface unit is the part of the interface-unit assembly and while the device is the part of the device assembly forming an interface-unit-device assembly.

In some aspects, the techniques described herein relate to a method, further including, before welded the interface-unit base to the conductive trace, separating an interface-unit-device unit from the interface-unit-device assembly, wherein the interface-unit-device unit includes a single count of the device.

In some aspects, the techniques described herein relate to a method, wherein soldering the contact pad to the interface-unit solderable layer is performed before welding the interface-unit base to the conductive trace.

In some aspects, the techniques described herein relate to a method, wherein: the assembly further includes an additional conductive trace including aluminum, the device includes an additional contact pad including copper, the assembly includes an additional interface unit including an additional interface-unit solderable layer and an additional interface-unit base including aluminum, the method further includes soldering the additional contact pad to the additional interface-unit solderable layer thereby forming an additional solder patch such that the additional solder patch mechanically and electrically interconnects the additional contact pad and the additional interface-unit solderable layer, and the method further includes welding the additional interface-unit base to the additional conductive trace forming an additional weld such that the additional weld mechanically and electrically interconnects the additional interface-unit base and the additional conductive trace.

In some aspects, the techniques described herein relate to an assembly including: a first conductive element, including a first surface and a second surface opposite of the first surface such that the first surface and the second surface define a thickness of the first conductive element, wherein the first surface has a different surface roughness than the second surface; a protective layer, disposed on at least a portion of at least one of the first surface and the second surface of the first conductive element; and a second conductive element, directly interfacing and welded to the second surface of the first conductive element forming a weld such that an interface between the second conductive element and the first conductive element is substantially free from other components.

In some aspects, the techniques described herein relate to an assembly, further including an additional conductive component soldered to the first surface of the first conductive element such that a solder patch is positioned between and forms an interface between the first conductive element and additional conductive components.

In some aspects, the techniques described herein relate to an assembly, wherein the second surface has a lower surface roughness than the first surface.

In some aspects, the techniques described herein relate to an assembly, wherein the first surface is substantially free from any organic solderability preservatives.

In some aspects, the techniques described herein relate to an assembly, wherein the additional conductive component is operable as a passthrough contact.

In some aspects, the techniques described herein relate to an assembly, wherein the first conductive element is thinner than the second conductive element.

In some aspects, the techniques described herein relate to an assembly, wherein: the first conductive element has a thickness of between 35 micrometers and 125 micrometers, and the second conductive element has a thickness of between 300 micrometers and 700 micrometers.

In some aspects, the techniques described herein relate to an assembly, wherein: the first conductive element is operable as a voltage-sense harness, and the second conductive element is operable as a battery-module busbar.

In some aspects, the techniques described herein relate to an assembly, wherein the weld is formed between the second conductive element and the first conductive element using ultrasonic welding or laser welding.

In some aspects, the techniques described herein relate to an assembly, wherein: the first conductive element includes copper, and the second conductive element includes copper.

In some aspects, the techniques described herein relate to an assembly, wherein the second surface has a higher surface roughness than the first surface.

In some aspects, the techniques described herein relate to an assembly, wherein the second surface is substantially free from any organic solderability preservatives.

In some aspects, the techniques described herein relate to an assembly, wherein the second surface has a lower surface roughness than the first surface.

In some aspects, the techniques described herein relate to an assembly, wherein the first surface is substantially free from any organic solderability preservatives.

In some aspects, the techniques described herein relate to a method of forming an assembly including: providing a first conductive element, including a first surface and a second surface opposite of the first surface, wherein: the first surface is covered by a protective layer, and the second surface is covered by an additional protective layer; patterning the first conductive element thereby forming a first conductive trace and a second conductive trace separated by a gap from each other; treating the second surface, wherein: the additional protective layer is removed from the second surface while treating the second surface, and after treating the second surface, the first surface has a different surface roughness than the second surface; and welding a second conductive element to the second surface of the first conductive element thereby forming a weld such that an interface between the second conductive element and the first conductive element is substantially free from other components.

In some aspects, the techniques described herein relate to a method, wherein: treating the second surface includes removing burs from the gap, the first conductive trace, the second conductive trace, and the burs are formed during patterning of the first conductive element.

In some aspects, the techniques described herein relate to a method, wherein removing the burs is performed using mechanical polishing.

In some aspects, the techniques described herein relate to a method, wherein patterning the first conductive element is performed using a laser.

In some aspects, the techniques described herein relate to a method, wherein: the first conductive trace and the second conductive trace are supported using a support layer, the support layer spans the gap and faces the first surface, and the protective layer and is positioned between the support layer and each of the first conductive trace and the second conductive trace.

In some aspects, the techniques described herein relate to a method, wherein a portion of the protective layer remains uncovered by the support layer.

In some aspects, the techniques described herein relate to a method, wherein welding the second conductive element to the first conductive element is performed using ultrasonic welding.

In some aspects, the techniques described herein relate to a method, wherein: the first conductive element includes copper, and the second conductive element includes aluminum.

In some aspects, the techniques described herein relate to a method, further including soldering an additional conductive component to the first surface of the first conductive element thereby forming a solder patch between the first conductive element and additional conductive components.

In some aspects, the techniques described herein relate to a method, wherein, during soldering, the solder patch is formed over the protective layer that is partially removed at an interface between the solder patch and the first conductive element.

These and other embodiments are described further below with reference to the figures.

BRIEF DESCRIPTION OF THE DRAWINGS

The included drawings are for illustrative purposes and serve only to provide examples of possible structures and operations for the disclosed inventive systems, apparatus, and methods. These drawings in no way limit any changes in form and detail that may be made by one skilled in the art without departing from the spirit and scope of the disclosed implementations.

FIGS. 14A-14E are schematic views of different stages during the fabrication of an assembly in accordance with the method of FIG. 13A, in accordance with some examples.

DETAILED DESCRIPTION

Introduction

Figure 1A:
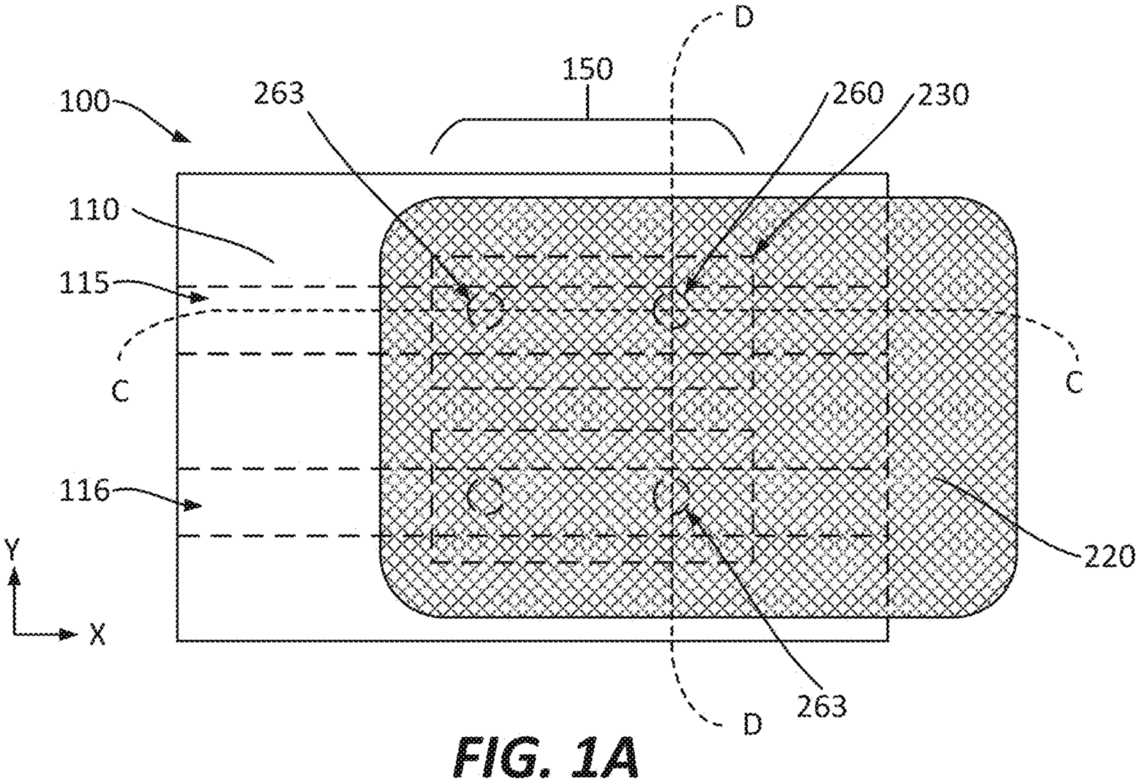
FIG. 1A is a schematic top view of an assembly comprising a flexible interconnect circuit, a weldable transition unit, and a printed circuit board, in accordance with some examples.

In the following description, numerous specific details are outlined to provide a thorough understanding of the presented concepts. In some examples, the presented concepts are practiced without some or all of these specific details. In other examples, well-known process operations have not been described in detail to unnecessarily obscure the described concepts. While some concepts will be described in conjunction with specific examples, it will be understood that these examples are not intended to be limiting.

Flexible interconnect circuits are used to deliver power and/or signals and are used for various applications, such as vehicles, appliances, electronics, and the like. One example of such flexible interconnect circuits is a harness or, more specifically, a voltage-sense harness. Another example is a battery interconnect circuit (e.g., operable as bus bars). Conventional harnesses use sets of stranded round wires. A separate polymer shell insulates each wire, adding to the size and weight of the harness. Unlike conventional harnesses, flexible interconnect circuits described herein have thin flat profiles, enabled by thin electrical conductors that can be positioned side-by-side. Each electrical conductor can have a flat rectangular profile. Furthermore, unlike conventional bus bars, flexible interconnect circuits can provide additional functionality, such as in-situ insulators, integrated fusible links, and the like.

In some examples, electrical conductors (positioned next to each other) are formed from the same metal sheet (e.g., foil). For purposes of this disclosure, the term "interconnect" is used interchangeably with "interconnect circuit", the term "conductive layer"—with "conductor" or "conductor layer", and the term "insulating layer"—with "insulator".

Typically, to connect external components to flexible circuits having conductive traces made from chemically etched copper, nickel tabs are soldered to the copper traces. The copper traces are typically too thin for reliable welding components directly to them. Often, nickel tabs are soldered to the copper traces in the first step of a two-step process. Second, external components are typically then soldered to the soldered-on nickel tabs.

External components may include, for example, individual electronic components such as temperature sensors or fusing elements, printed circuit board assemblies (PCBAs) with a few electronic components, or larger and more complex PCBAs.

Advantageously, the thicker Al or Cu conductors in some flexible interconnect circuits allows laser welding directly to other components without soldering an intervening nickel tab to the flexible interconnect circuit. Instead, a weldable transition unit may be included in, for example, a PCBA. The PCBA may then be directly welded to the flexible circuit. Eliminating a manufacturing step in the process of attaching external components to flexible interconnect circuits may be desirable by lowering costs associated both with labor and component costs.

Transition pieces integrated into PCBAs provide weldable material on the PCBA, which also often utilize thin copper traces for conductivity between components. Laser welding directly to thin copper traces is not reliable. Welds penetrate through the depth of the thin copper trace, making a resulting weld mechanically weak.

Described herein are flexible interconnect circuits comprising conductive traces, external components, and weldable transition units. Weldable transition units connected to external components make the external components highly weldable to the conductive traces of the flexible circuit. Also described are methods for fabricating flexible interconnect circuits with a single welding step connecting external components comprising weldable transition units to the conductive traces.

Figure 1B:
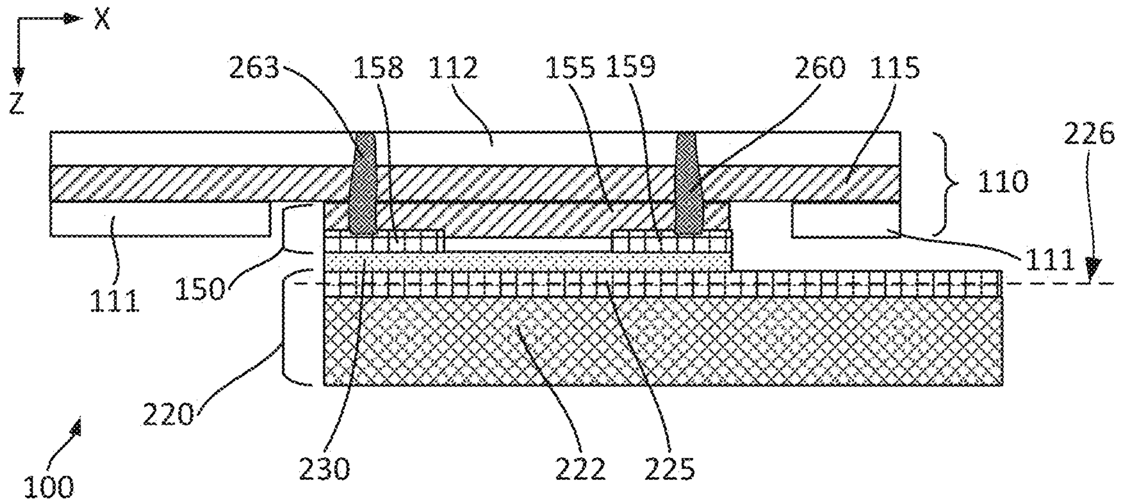
FIG. 1B is a schematic cross-sectional view of the assembly of FIG. 1A along the line C-C, in accordance with some examples.

FIGS. 1A-1F and 2A-2B: Examples of Assemblies With Weldable Transition Units and PCBs FIG. 1A is a schematic top view of assembly 100 comprising a flexible interconnect circuit 110, a weldable transition unit 150, printed circuit board 220, and a solder patch 230, in accordance with some examples. Flexible interconnect circuit 110 has a plane parallel with the X-Y plane of the figure. Flexible interconnect circuit 110 comprises a conductive trace 115, which is not visible in this view, comprising a conductive material. FIG. 1B is a schematic cross-sectional view of assembly 100 at line C-C of FIG. 1A, in accordance with some examples. Conductive trace 115 is visible in this view. In some examples, conductive trace 115, as well as other traces (if present), have a uniform thickness throughout the entire circuit boundary. For example, conductive trace 115 as well as other traces can be formed from the same sheet of metal (even when these traces are disjoined). In some examples, all conductive trace 115 as well as other traces (if present) are formed from the same material, e.g., aluminum, copper, or the like. The use of aluminum (instead of copper) may help with lowering the overall circuit weight and also with lowering the minimum achievable fuse current rating. Specifically, aluminum has a higher resistivity and lower melting temperature than copper. As such, forming fusible links in an aluminum conductive layer may allow for more precise control of the fusible parameters (for the same size tolerance). In general, conductive trace 115 may be formed from any conductive material that is sufficiently conductive (e.g., a conductivity being greater than 10^6 S/m or even greater than 10^7 S/m to allow for current flow through the foil with low power loss. In some examples, flexible interconnect circuit 110 of assembly 100 may further comprise other traces. For example, in some examples, flexible interconnect circuit 110 of assembly 100 comprises an additional conductive trace 116. Conductive trace 115 and additional conductive trace 116 can be positioned on the same circuit level (e.g., in the same plane and formed from the same metal foil) or different circuit levels (e.g., when different conductive traces form a stack along the thickness of flexible interconnect circuit 110/the Z-axis). In some examples, the conductive material of conductive trace 115 is aluminum.

Also shown in FIG. 1B, the flexible interconnect circuit 110 further comprises a first insulating layer 111 and a second insulating layer 112 such that the conductive trace 115 at least partially extends between and is adhered to the first insulating layer 111 and the second insulating layer 112. In some examples, first insulating layer 111 and second insulating layer 112 may initially be processed in a sheet or roll form and may subsequently be laminated to the conductive layer using, for example, adhesive material. First insulating layer 111 and second insulating layer 112 may include (or be formed from) polyimide (PI), polyethylene naphthalate (PEN), polyethylene terephthalate (PET), polymethyl methacrylate (PMMA), ethyl vinyl acetate (EVA), polyethylene (PE), polyvinyl fluoride (PVF), polyamide (PA), and/or polyvinyl butyral (PVB). Additional aspects (e.g., thicknesses) of first insulating layer 111 and second insulating layer 112 are described below.

The thickness of one or both first insulating layer 111 and second insulating layer 112 may be between 1 micrometer and 500 micrometers or, more specifically, between 10 micrometers and 125 micrometers. In some examples, each of first insulating layer 111 and second insulating layer 112 includes an adhesive sublayer facing conductive traces, e.g., for lamination to conductive traces and also to each other. These adhesive sublayers may be also used for directly laminating first insulating layer 111 and second insulating layer 112 (beyond the conductive layer boundaries), e.g., for edge sealing of flexible interconnect circuit 110. In some examples, the surface of first insulating layer 111 and/or second insulating layer 112 (e.g., the surface facing away from conductive traces) comprises an adhesive sublayer for bonding this insulating layer to an external structure (e.g., a supporting panel). First insulating layer 111 and second insulating layer 112 provide the electrical isolation and mechanical support to conductive traces.

The conductive trace 115 is adhered to the first insulating layer 111 and the second insulating layer 112. In some examples, as shown in FIG. 1B, a portion of the conductive trace 115 forms the weld 260 with the weldable transition unit 150 and extends past the first insulating layer 111 and overlaps with the second insulating layer 112.

Also shown in FIG. 1B, the printed circuit board 220 comprises an insulating layer 222 and a solderable trace 225. The solderable trace 225 directly interfaces and is mechanically coupled with the insulating layer 222. In some examples, the insulating layer 222 is formed from an electrically insulating material. For example, the insulating layer 222 may be formed from a glass fiber reinforced epoxy or polymer resin. In some examples, the solderable trace 225 is formed from copper or a copper alloy.

Also shown in FIG. 1B, the weldable transition unit 150 comprises a transition pad 155, a first solderable pad 158, and a second solderable pad 159. Shown in FIG. 1E is a schematic view of weldable transition unit 150, in accordance with some examples. Transition pad 155 comprises a material having the same composition as the conductive material of the conductive trace 115. As shown in FIG. 1E, transition pad 155 has a first transition pad side 156 and a second transition pad side 157 opposite the first transition pad side 156. The first transition pad side 156 directly interfaces the conductive trace 115 and is welded to the conductive trace 115, forming a weld 260. Transition pad 155 and first solderable pad 158 directly interface one another, are mechanically coupled, and are electrically coupled. Transition pad 155 and second solderable pad 159 directly interface one another, are mechanically coupled, and are electrically coupled. First solderable pad 158 does not interface second solderable pad 159.

Transition pad 155 has a thickness measured perpendicular to the plane of the flexible interconnect circuit 110, shown in FIG. 1E as $T_{AB}$. In some examples, transition pad 155 has a thickness greater than 40 micrometers, greater than 100 micrometers, or even greater than 500 micrometers. In some examples, transition pad 155 has a thickness less than 800 micrometers, less than 600 micrometers, less than 400 micrometers, or even less than 200 micrometers. In some examples, $T_{AB}$ is 50-70 micrometers. The thickness $T_{AB}$ can be selected to balance the ease of weldability to conductive trace 115 and the thickness sufficient for carrying electrical current between conductive trace 115 and solderable trace 225. Without being restricted to any particular theory, it is believed that welding components having the same thickness is easier. In some examples, transition pad 155 and conductive trace 115 have thicknesses, measured in a direction normal to the plane of flexible interconnect circuit 110, that differ by less than 50%, less than 30%, or less than 10%.

In some examples, first solderable pad 158 and second solderable pad 159 are each formed from a material selected from the group consisting of nickel, copper, tin, silver, nickel, platinum, gold, and brass. In some examples, first solderable pad 158 and second solderable pad 159 are both formed from copper. In some other examples, the first solderable pad 158 and the second solderable pad 159 are each formed from a different material selected from the group consisting of nickel, copper, tin, silver, nickel, platinum, gold, and brass. A first solderable pad 158 and a second solderable pad 159 formed from copper may be mechanically coupled with the transition pad 155 by, for example, electroplating, electroless plating, roll machining, or explosive cladding. In some examples, first solderable pad 158 has a thickness $T_{CB}$, measured in the plane of flexible interconnect circuit 110, of at least 20 micrometers, at least 50 micrometers, at least 120 micrometers, or even at least 200 micrometers. In some examples, $T_{CB}$ is 10-30 micrometers. In some examples, first solderable pad 158 is a layer of a material comprising tin at least partially coating transition pad 155. Because soldering to some metals can be challenging, first solderable pad 158 and the second solderable pad 159 provide suitable surfaces for connecting by soldering to the solderable trace 225 of a printed circuit board 220. In some examples, the soldering is by reflow soldering. Other arrangements with more than two separate portions of first solderable pad 158 directly interfacing one side of transition pad 155 are within the scope.

Figure 1C:
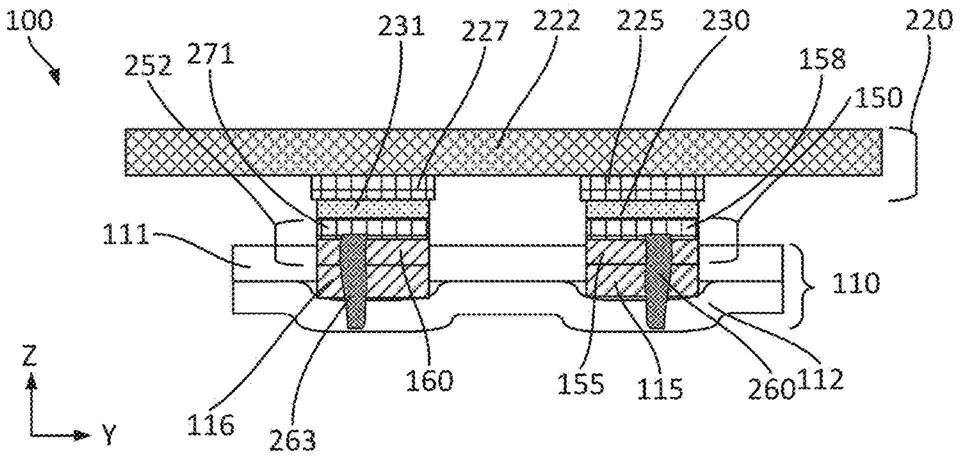
FIG. 1C is a schematic cross-sectional view of the assembly of FIG. 1A along the line D-D, in accordance with some examples.
Figure 1D:
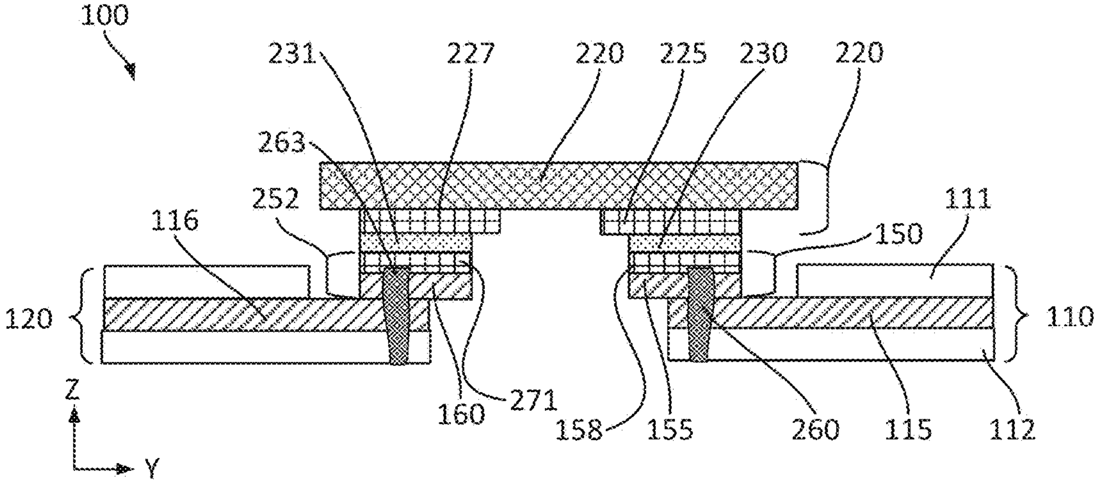
FIG. 1D is a schematic cross-sectional view of an assembly comprising a flexible interconnect circuit, a weldable transition unit, and a printed circuit board, in accordance with some examples.
Figure 1E:
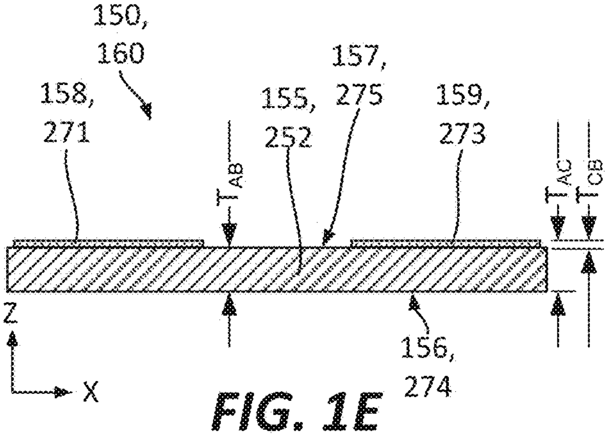
FIG. 1E is a schematic side view of a weldable transition unit, in accordance with some examples.
Figure 1F:
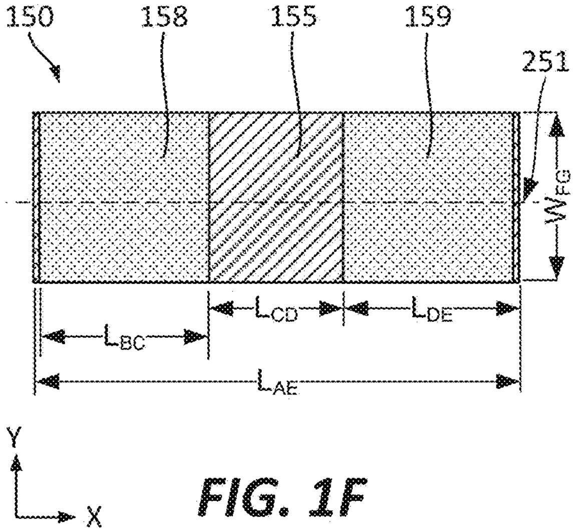
FIG. 1F is a schematic top view of a weldable transition unit 150, in accordance with some examples.

FIG. 1F is a schematic top view of weldable transition unit 150, in accordance with some examples. As shown in FIG. 1F., weldable transition unit 150 has a length $L_{AE}$ measured in the plane of flexible interconnect circuit 110. In some examples, $L_{AE}$ is at least 3 millimeters, at least 5 millimeters, at least 8 millimeters, or even at least 10 millimeters. The first solderable pad 158 and the second solderable pad 159 are separated by a distance $L_{CD}$ measured along the side of transition pad 155 in the direction of $L_{AE}$. In some examples, $L_{CD}$ is greater than or equal to 0.5 millimeters, greater than or equal to 1 millimeter, greater than or equal to 2 millimeters, or even greater than or equal to 3 millimeters. The weldable transition unit 150 has a width $W_{FG}$ measured in the plane of the flexible interconnect circuit 110. The width $W_{FG}$ is measured in a direction orthogonal to the direction the length is measured in. The weldable transition unit 150 has an aspect ratio, which is the ratio of $W_{FG}$ to $L_{AE}$. In some examples, the aspect ratio is less than 0.5, less than 0.4, less than 0.3, or even less than 0.2. In some examples, the aspect ratio is greater than 0.1, greater than 0.25, greater than 0.35, or even greater than 0.45.

The lengths of the first solderable pad 158 and the second solderable pad 159 in the direction of $L_{AE}$, shown as $L_{BC}$ and $L_{DE}$ in FIG. 1F, may be, combined, less than the difference between $L_{AE}$ and $L_{CD}$. In other words, in some examples, portions of first solderable pad 158 or a second solderable pad 159 may each separately extend to one or both edges of a side of transition pad 155 that $L_{AE}$ is measured from. In other examples, either or both of the first solderable pad 158 and the second solderable pad 159 may not extend to either of these edges. Also shown in FIG. 1F, in some examples, the first solderable pad 158 and the second solderable pad 159 may extend to other edges of the side of transition pad 155. In other examples, portions of either or both of the first solderable pad 158 and the second solderable pad 159 do not extend to these edges. As shown in FIG. 1F, in some examples, the shape projected by the first solderable pad 158 and the second solderable pad 159 on the plane of flexible interconnect circuit 110 is rectangular. Other shapes, for example circles and ovals, are within the scope.

The flexible interconnect circuit 110 comprises a solder patch 230. The solder patch 230 is disposed between the solderable trace 225 and each of the first solderable pad 158 and the second solderable pad 159. The solder patch 230 electrically and mechanically interconnects the solderable trace 225 with each of the first solderable pad 158 and the second solderable pad 159. The first solderable pad 158 and second solderable pad 159 are mechanically and electrically coupled with the transition pad 155, which is welded to the conductive trace 115. The conductive trace 115 is thereby mechanically and electrically coupled with the solderable trace 225.

The separation of the first solderable pad 158 and second solderable pad 159 along the length of weldable transition unit 150 provides a benefit. During attachment of printed circuit board 220 to weldable transition unit 150 by soldering, capillary force between molten solder, the solderable trace 225, the first solderable pad 158, and the second solderable pad 159, may center each of the first solderable pad 158 and the second solderable pad 159 relative to solderable trace 225 in a direction perpendicular to $L_{AE}$. This centering may align weldable transition unit 150 with solderable trace 225. Alignment may remain as the solder cools and solidifies, thereby providing desirable alignment of components of assembly 100. A weldable transition unit 150 that is aligned may provide benefits in simplification and accuracy of later manufacturing steps in fabrication of assembly 100, including forming the weld between the weldable transition unit 150 and the conductive trace 115. In some examples, the weldable transition unit 150 has a transition pad axis 251 intersecting both the first solderable pad 158 and the second solderable pad 159 and in a plane parallel with the plane of the flexible interconnect circuit 110. In these examples, the solderable trace 225 has a solderable trace axis 226 in a plane parallel with the plane of the flexible interconnect circuit 110. The transition pad axis 251 is substantially parallel with the solderable trace axis 226. In other words, the transition pad axis 251 is aligned with the solderable trace axis 226.

The first transition pad side 156 of transition pad 155 directly interfaces and is welded to flexible interconnect circuit 110, forming weld 260. Transition pad 155 is thereby mechanically and electrically coupled with conductive trace 115 via a weld 260. In some examples, the weld is a laser weld or an ultrasonic weld. In some examples, transition pad 155 is electrically and mechanically connected to flexible interconnect circuit 110 by additional welds, for example as shown in FIG. 1B, by additional weld 263.

It should be noted that assembly 100, by having a weldable transition unit 150 to electrically and mechanically connect a printed circuit board 220 to the flexible interconnect circuit 110, provides several benefits over connectors. First, the cost of weldable transition unit 150 may be significantly less than a connector. In addition, different connectors may be required to be designed and manufactured for different combinations of flexible interconnect circuit 110 and printed circuit board 220. For example, different connectors would be required to connect a printed circuit board to a flexible interconnect circuit with four conductive traces than one with 12 conductive traces. In contrast, one design of weldable transition unit 150 may be used in the connection of numerous combinations of flexible interconnect circuits and printed circuit boards, thereby reducing design and manufacturing cost. Second, the total height of the assembly 100, measured from conductive trace 115 to the opposite side of printed circuit board 220 in a direction normal to the plane of flexible interconnect circuit 110, may be significantly less than the height of a connector. This may be particularly desirable in electric vehicles, where internal space is often at a premium. Lowering the height of the assembly may make routing flexible interconnect circuit 110 within internal spaces of an electric vehicle, for example within a battery compartment, more straightforward.

FIG. 1C is a schematic cross-sectional view of assembly 100 at line D-D of FIG. 1A, in accordance with some examples. In some examples, as shown in FIG. 1C, multiple conductive traces of a printed circuit board 220 may be connected to multiple conductive traces of a flexible interconnect circuit. For example, in FIG. 1C, the flexible interconnect circuit 110 comprises an additional conductive trace 116 and an additional weldable transition unit 252, and the additional conductive trace 116 is formed from a conductive material. In some examples, the additional conductive trace 116 is formed from aluminum or an aluminum alloy. Printed circuit board 220 further comprises an additional solderable trace 227. The additional solderable trace 227 directly interfaces and is mechanically coupled to the insulating layer 222. The additional weldable transition unit 252 comprises an additional transition pad 160, a third solderable pad 271 and a fourth solderable pad 273. In some examples, the additional transition pad 160 comprises a material with the same composition as the conductive material of the additional conductive trace 116. The additional transition pad 160 comprises a third transition pad side 274 and a fourth transition pad side 275 opposite the third transition pad side 274. The third transition pad side 274 directly interfaces the additional conductive trace 116. The additional transition pad 160 is welded to the additional conductive trace 116, forming additional weld 263. The additional transition pad 160 is mechanically and electrically coupled to the additional conductive trace 116 by the additional weld 263. In addition to additional transition pad 160, additional weldable transition unit 252 also comprises a third solderable pad 271 and a fourth solderable pad 273. The third solderable pad 271 and the fourth solderable pad 273 are each formed from a material having a different composition than the additional transition pad 160. The third solderable pad 271 and the fourth solderable pad 273 each directly interface the fourth transition pad side 275 and the fourth solderable pad 273 does not interface the third solderable pad 271. The third solderable pad 271 and the fourth solderable pad 273 are electrically and mechanically coupled with the additional solderable trace 227 of printed circuit board 220 by an additional solder patch 231. The additional solder patch 231 is disposed between and directly interfacing the additional solderable trace 227 and each of the third solderable pad 271 and the fourth solderable pad 273.

In some examples, the weldable transition unit 150 and the additional weldable transition unit 252 may interconnect two separate flexible interconnect circuits to one printed circuit board. FIG. 1D is a schematic cross-sectional view of assembly 100, in accordance with some examples. In FIG. 1D, assembly 100 comprises additional flexible interconnect circuit 120. Additional flexible interconnect circuit 120 comprises an additional conductive trace 116, an additional weldable transition unit 252, a third solderable pad 271, and an additional solderable trace 227 electrically coupled with the third solderable pad 271 by additional solder patch 231. In the example shown in FIG. 1D, printed circuit board 220 is mechanically and electrically connected to two separate flexible interconnect circuits, flexible interconnect circuit 110 and additional flexible interconnect circuit 120.

Figure 2A:
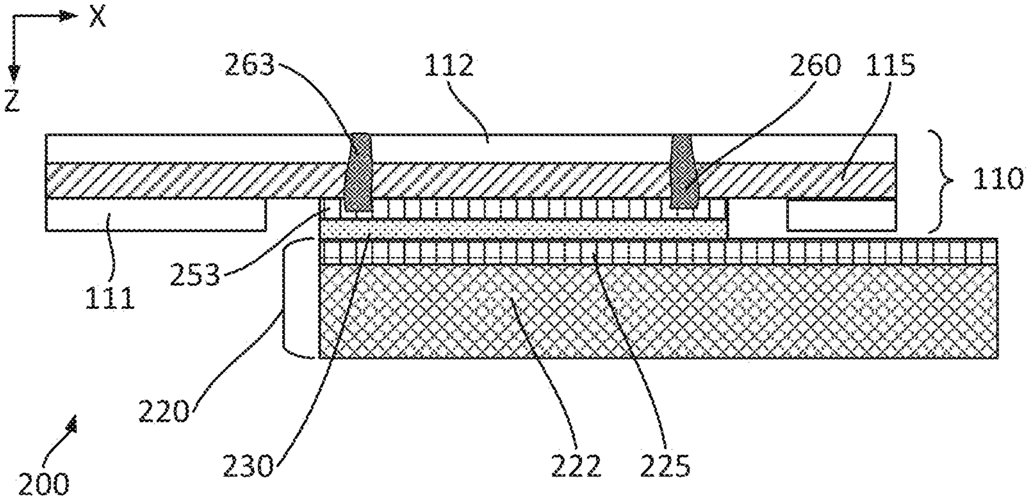
FIG. 2A is a is a schematic cross-sectional view of an assembly comprising a flexible interconnect circuit, a PCB-attachable transition unit, and a printed circuit board, in accordance with some examples.

FIG. 2A is a cross-sectional view of an assembly 200 comprising a flexible interconnect circuit 110, a Printed circuit board-attachable transition unit 253, and printed circuit board 220, in accordance with some examples. Examples of flexible interconnect circuit 110 and printed circuit board 220 have been described above. As shown in FIG. 2A, assembly 200 comprises a Printed circuit board-attachable transition unit 253. Printed circuit board-attachable transition unit 253 is positioned adjacent to the flexible interconnect circuit 110. Printed circuit board-attachable transition unit 253 is electrically connected to conductive trace 115 via weld 260. In some examples of assembly 200, Printed circuit board-attachable transition unit 253 directly interfaces conductive trace 115. In some examples, Printed circuit board-attachable transition unit 253 has a thickness measured perpendicular to the plane of the flexible interconnect circuit 110 greater than 300 micrometers, greater than 500 micrometers, or even greater than 700 micrometers. In some examples, Printed circuit board-attachable transition unit 253 has a thickness measured perpendicular to the plane of the flexible interconnect circuit 110 less than 800 micrometers, less than 600 micrometers, or even less than 400 micrometers. In some examples, Printed circuit board-attachable transition unit 253 has a thickness measured perpendicular to the plane of the flexible interconnect circuit 110 of 200-800 micrometers. The thickness of Printed circuit board-attachable transition unit 253 can be selected to balance the ease of weldability to conductive trace 115 and the thickness sufficient for carrying electrical current between conductive trace 115 and solderable trace 225. Printed circuit board-attachable transition unit 253 having different forms are within the scope. For example, Printed circuit board-attachable transition unit 253 may be a metal tab soldered to solderable trace 225 by solder patch 230. Specifically, Printed circuit board-attachable transition unit 253 may be a tab formed from nickel soldered to solderable trace 225. In other examples, Printed circuit board-attachable transition unit 253 may be a press-fit pin physically connected to printed circuit board 220 and electrically connected to Printed circuit board-attachable transition unit 253. Specifically, a press-fit pin may be formed from copper and coated with a layer of tin or a layer of nickel or multiple layers of tin and nickel.

Figure 2B:
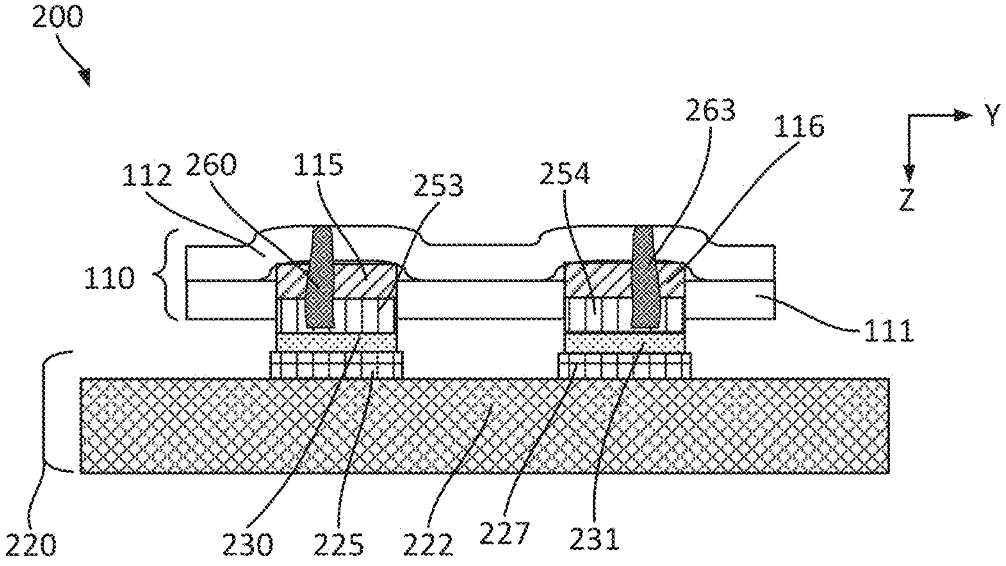
FIG. 2B is a is a schematic cross-sectional view of an assembly comprising a flexible interconnect circuit, a PCB-attachable transition unit, an additional PCB-attachable transition unit, and a printed circuit board, in accordance with some examples.

FIG. 2B is a cross-sectional view of an assembly 200 comprising a flexible interconnect circuit 110, a Printed circuit board-attachable transition unit 253, an additional conductive trace 116, an additional printed circuit board-attachable transition unit 254, and Printed circuit board 220, in accordance with some examples. Additional conductive trace 116 comprises a conductive material. Additional printed circuit board-attachable transition unit 254 is positioned adjacent to flexible interconnect circuit 110. In these examples, printed circuit board 220 further comprises an additional solderable trace 227 electrically connected to additional printed circuit board-attachable transition unit 254 by an additional solder patch 231.

Figure 3:
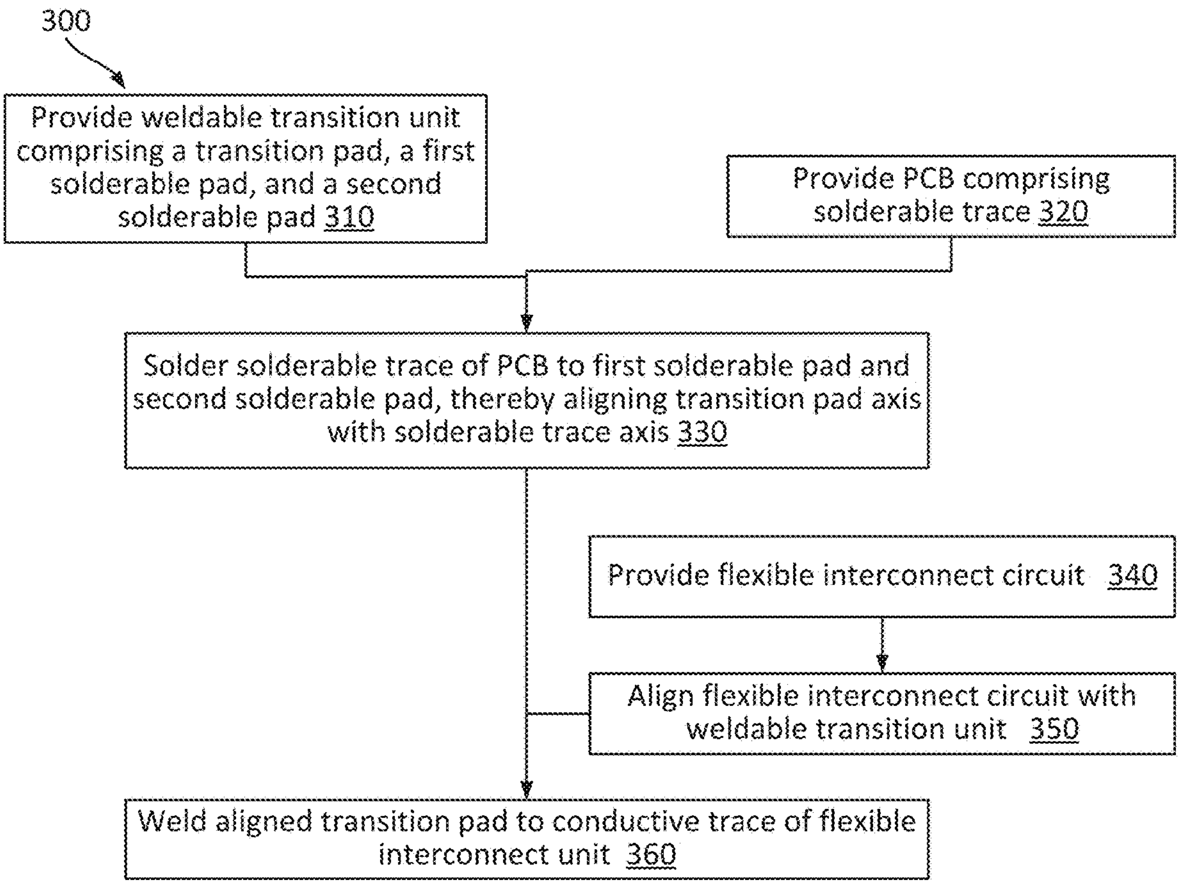
FIG. 3 is a process flowchart corresponding to a method of fabricating an assembly comprising a flexible interconnect circuit, at least one weldable interface unit, and at least one printed circuit board connected to the flexible interconnect circuit, in accordance with some examples.

FIG. 3: Examples of Methods for Fabricating Assemblies With Weldable Transition Units FIG. 3 is a process flowchart representing method 300 of fabricating assembly 100 comprising flexible interconnect circuit 110, at least one weldable transition unit 150, and at least one printed circuit board 220, in accordance with some examples.

In some examples, method 300 may comprise (block 310) providing a weldable transition unit 150 comprising a transition pad 155 a first solderable pad 158, and a second solderable pad 159. Transition pad 155 comprises a conductive material. Transition pad 155 has a first transition pad side 156 and a second transition pad side 157 opposite the first transition pad side 156. The first solderable pad 158 directly interfaces the second transition pad side 157 and the first solderable pad 158 and the second transition pad side 157 are mechanically and electrically coupled. The second solderable pad 159 also directly interfaces the second transition pad side 157 and the second solderable pad 159 and the second transition pad side 157 are mechanically and electrically coupled. The First solderable pad 158 does not interface second solderable pad 159.

In some examples, transition pad 155 comprises aluminum. In some examples, first solderable pad 158 and second solderable pad 159 are formed from a material selected from the group consisting of nickel, copper, tin, silver, nickel, platinum, gold, and brass. In some examples, first solderable pad 158 and second solderable pad 159 are formed from copper. In some examples, first solderable pad 158 and second solderable pad 159 each comprise a layer of a material comprising tin at least partially coating the first solderable pad 158 and the second solderable pad 159. Other aspects of the transition pad 155, the first solderable pad 158, and the second solderable pad 159 are provided above. In some examples, more than one transition pad 155 is provided.

In some examples, method 300 may comprise (block 320) providing a printed circuit board 220 comprising a solderable trace 225. The printed circuit board 220 may comprise more than one solderable trace. The printed circuit board 220 may also further comprise additional components connected to 220, for example, by soldering. In some examples, the solderable trace 225 may comprise copper.

In some examples, method 300 may comprise (block 330) soldering solderable trace 225 to the first solderable pad 158 and the second solderable pad 159. During soldering, the first solderable pad 158 and the second solderable pad 159 are positioned such that a solder patch 230 is positioned between the solderable trace 225 and each of the first solderable pad 158 and the second solderable pad 159 and heat is applied to melt the solder of the solder patch 230. Molten solder is drawn to the surfaces of the first solderable pad 158, the second solderable pad 159, and the solderable trace 225. Capillary forces between the molten solder and each of the solderable trace 225, the first solderable pad 158 and the second solderable pad 159 aligns the weldable transition unit 150 with the solderable trace 225. Weldable transition unit 150 may be allowed to move relative to printed circuit board 220 during soldering. Printed circuit board 220 may be allowed to move relative to weldable transition unit 150 during soldering.

As the solder of the solder patch 230 cools, it electrically and mechanically connects printed circuit board 220 to the weldable transition unit 150. During soldering, solder may be applied to the surfaces after they have been heated to a soldering temperature. In other examples, solder may first be applied to one or both surfaces prior to heating. Soldering may heat components including transition pad 155 and printed circuit board 220 to temperatures that exceed safe temperatures for other components of assembly 100, for example, for flexible interconnect circuit 110. In some examples, soldering may be by reflow soldering.

In some examples, method 300 comprises (block 340) providing a flexible interconnect circuit 110 comprising a conductive trace 115. In some examples, conductive trace 115 comprises aluminum. Flexible interconnect circuit 110 comprises first insulating layer 111 and a second insulating layer 112. The conductive trace 115 is positioned between first insulating layer 111 and second insulating layer 112. In some examples, flexible interconnect circuit 110 comprises additional conductive trace 116. Conductive trace 115 comprises a conductive material. Other aspects of flexible interconnect circuit 110 are detailed above.

In some examples, method 300 comprises (block 350) aligning the flexible interconnect circuit 110 with the weldable transition unit 150. During aligning the flexible interconnect circuit 110 with the weldable transition unit 150, the weldable transition unit 150 may directly interface the flexible interconnect circuit 110.

In some examples, method 300 comprises (block 360) welding the transition pad 155 of weldable transition unit 150 to the conductive trace 115 of the flexible interconnect circuit 110. Welding the transition pad 155 to the conductive trace 115 electrically and mechanically couples the weldable transition unit 150 with the conductive trace 115, thereby electrically and mechanically coupling the printed circuit board 220 with the flexible interconnect circuit 110. In some examples, welding is done by laser welding. In some other examples, welding is done by ultrasonic welding. In some examples, welding is completed before soldering the first solderable pad 158 and the second solderable pad 159 to the solderable trace 225. In other examples, welding is completed after soldering the first solderable pad 158 and the second solderable pad 159 to the solderable trace 225.

Figure 4A:
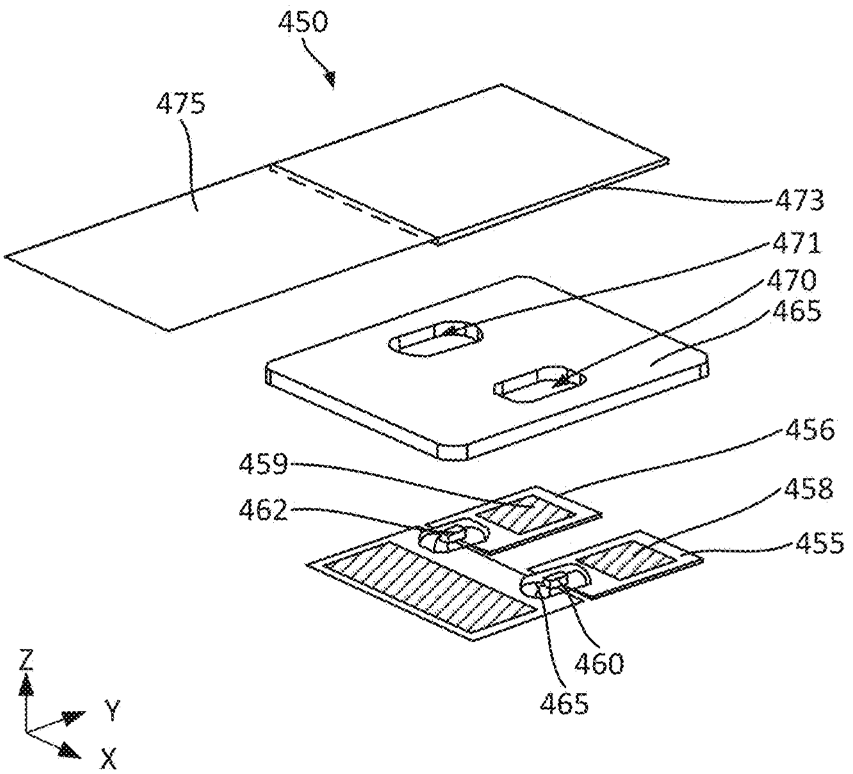
FIG. 4A is an exploded perspective schematic view of a weldable transition unit illustrating the relationship between various components, in accordance with some examples.
Figure 4B:
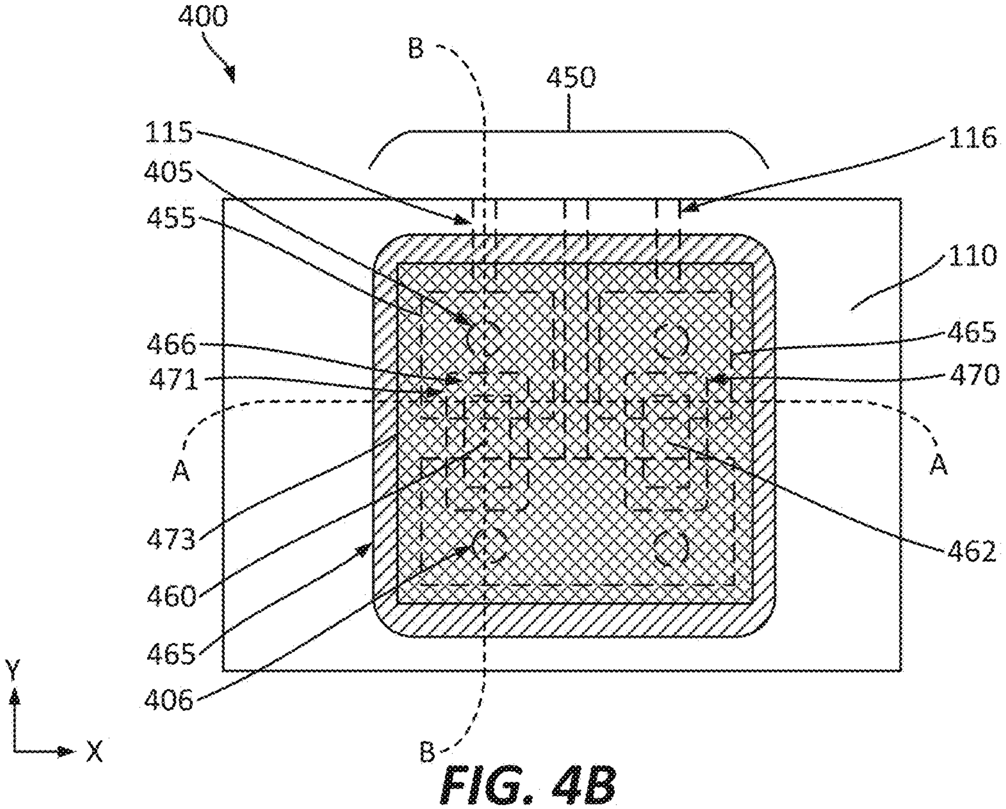
FIG. 4B is a schematic top view of an assembly comprising a weldable transition unit and a flexible interconnect circuit, in accordance with some examples.

FIGS. 4A-4F: Examples of Assemblies With Weldable Transition Units Comprising Stiffeners FIG. 4A is an exploded perspective schematic view of a weldable transition unit 450 comprising a transition pad 455, a surface mount device 460, a thermally conductive filler 466, a transition adhesive pad 458, a stiffener 465, and an opening 470 in accordance with some examples. FIG. 4B is a schematic top view of assembly 400 comprising weldable transition unit 450 and flexible interconnect circuit 110, in accordance with some examples. In this view, visible components of the weldable transition unit 450 include stiffener 465 and thermally conductive adhesive pad 473. Transition pad 455, surface mount device 460, thermally conductive filler 466, and opening 470 are not visible in this view.

Figure 4C:
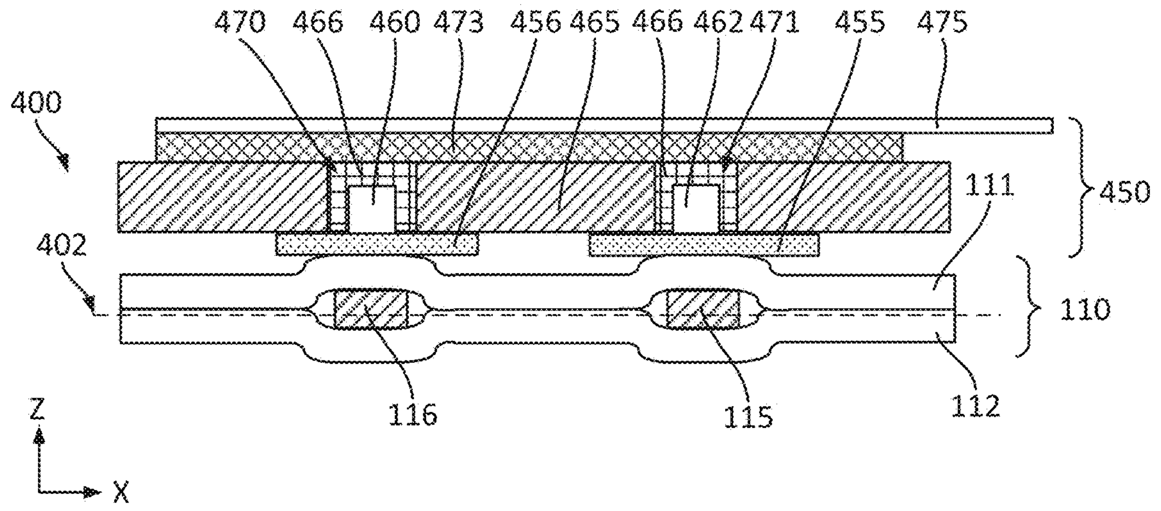
FIG. 4C is a schematic cross-sectional view of the assembly of FIG. 4B along the line A-A, in accordance with some examples.

FIG. 4C is a schematic cross-sectional view of assembly 400 at line A-A of FIG. 4B, in accordance with some examples. Shown in FIG. 4C are flexible interconnect circuit 110 and weldable transition unit 450. Flexible interconnect circuit 110 defines a plane 402 parallel with the X-Y plane of the figure. Flexible interconnect circuit 110 comprises first insulating layer 111, second insulating layer 112, and conductive trace 115 positioned between first insulating layer 111 and second insulating layer 112. Examples of conductive trace 115 are described above. In some examples, flexible interconnect circuit 110 comprises additional conductive trace 116. The conductive trace 115 comprises a conductive material. Conductive trace 115 and additional conductive trace 116 can be positioned on the same circuit level (e.g., in the same plane and formed from the same metal foil) or different circuit levels (e.g., when different conductive traces form a stack along the thickness of flexible interconnect circuit 110/the Z-axis).

Weldable transition unit 450 comprises transition pad 455, surface mount device 460, stiffener 465, opening 470, and thermally conductive filler 466. In some examples, weldable transition unit 450 further comprises a thermally conductive adhesive pad 473. In some examples, as also shown in FIG. 4C, weldable transition unit 450 further comprises additional transition pad 456, additional surface mount device 462, and additional opening 471. Transition pad 455 and additional transition pad 456, when present, directly interface flexible interconnect circuit 110. Surface mount device 460 is electronically and mechanically connected with transition pad 455 and additional surface mount device 462, when present, is electronically and mechanically connected with additional transition pad 456, for example, by soldering. Stiffener 465 interfaces transition pad 455 and stiffener 465 on a side of the transition pad 455 opposite the flexible interconnect circuit 110. Stiffener 465 comprises opening 470 and, when present, additional opening 471. Thermally conductive adhesive pad 473 interfaces stiffener 465 on a side opposite to transition pad 455.

Figure 4D:
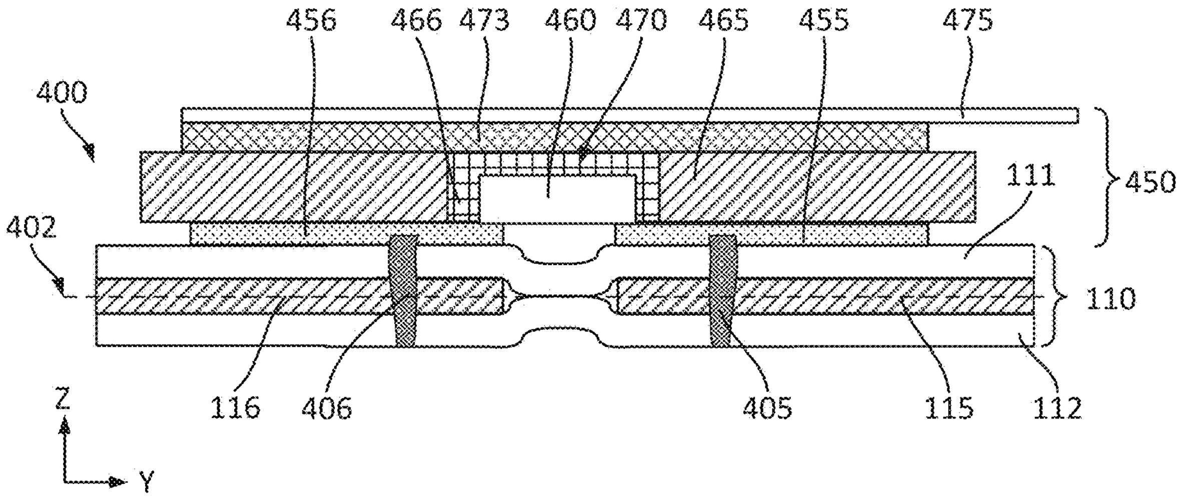
FIG. 4D is a schematic cross-sectional view of the assembly of FIG. 4B along the line B-B, in accordance with some examples.

FIG. 4D is a schematic cross-sectional view of assembly 400 at line B-B of FIG. 4B, in accordance with some examples. Shown in FIG. 4D is transition pad 455 mechanically connected to flexible interconnect circuit 110 and electrically connected to conductive trace 115 by weld 405. In some examples, as also shown in FIG. 4D, weldable transition unit 450 further comprises additional transition pad 456 and assembly 400 further comprises additional weld 406. When present, additional transition pad 456 is electrically connected to additional conductive trace 116 by additional weld 406. Surface mount device 460 is electronically and mechanically connected with transition pad 455 and, when it is present, additional transition pad 456, for example, by soldering. Surface mount device 460 is thereby electronically connected with conductive trace 115. When additional conductive trace 116, surface mount device 460 is also electronically connected with additional conductive trace 116. Transition pads allow using different materials for conductive elements at surface mount device 460 and flexible interconnect circuit 110 and to maintain consistent processing parameters when forming the connections between flexible interconnect circuit 110 and the transition pads, regardless of the device types. As such, different device types can be integrated into flexible interconnect circuit 110 (to form assembly 400) in a consistent and efficient manner. In some examples, additional transition pad 456 is soldered to a different device than surface mount device 460. In some examples, additional transition pad 456 is soldered to another electrical connection of surface mount device 460.

In some examples, the transition pad 455 and the conductive trace 115 have a substantially similar composition. For the purposes of this specification, a substantially similar composition is defined as varying by less than 10% atomic or even less than 5% atomic. Connecting the transition pad 455 and the conductive trace 115 by welding is more straightforward when they comprise the same conductive material. For example, welding a transition pad 455 formed from aluminum to a conductive trace 115 formed from aluminum is simpler than if the 155 were formed from copper. Weldable transition unit 450 is used for this purpose. In some examples, the weld is a laser weld or an ultrasonic weld. Referring to FIG. 4B, transition pad 455 is welded to conductive trace 115 forming weld 405. For example, weld 405 can be a laser weld and an ultrasonic weld. Laser welding employs a concentrated beam for melting and joining two components (e.g., two aluminum components) together. The beam can be very precise, resulting in minimal distortion of the welded components and requiring minimal weld areas. Laser welding can be used for thin conductive traces/interface-unit bases. Ultrasonic welding employs high-frequency waves to heat and bond two components and can be generally faster than laser welding. However, ultrasonic welding requires a larger footprint and can introduce more distortion in the welded material compared to laser welding.

Figure 4E:
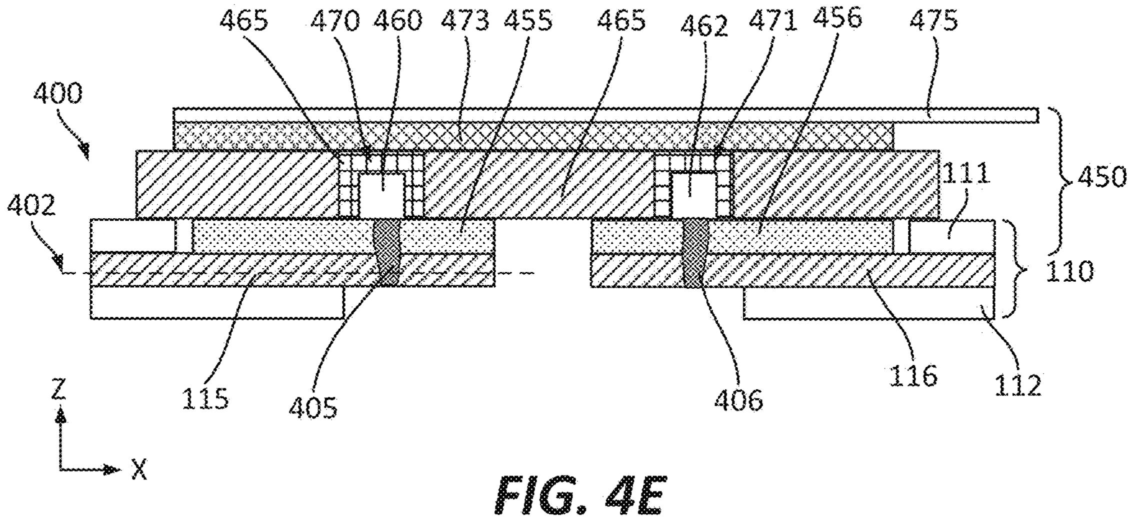
FIG. 4E is a schematic cross-sectional view of an assembly comprising a weldable transition unit and a flexible interconnect circuit, in accordance with some examples.

Referring again to FIG. 4D, in some examples, flexible interconnect circuit 110 further comprises a first insulating layer 111 and a second insulating layer 112 such that conductive trace 115 at least partially extends between and adhered to the first insulating layer 111 and the second insulating layer 112. Examples of first insulating layer 111 and second insulating layer 112 are described in detail above. In more specific examples as shown in FIG. 4E, a portion of the conductive trace 115, forming the weld 405 with the transition pad 455, extends past the first insulating layer 111 and partially overlaps with the second insulating layer 112. However, other examples are within the scope. For example, the portion of conductive trace 115, forming weld 405 with transition pad 455, may completely overlap insulating layer 112. In some examples, assembly 400 further comprises an additional conductive trace 116 comprising a conductive material. The weldable transition unit 450 further comprises an additional surface mount device 462 and an additional transition pad 456 comprising the conductive material of the additional conductive trace 116 and affixed to the flexible interconnect circuit 110 and electronically coupled with the additional conductive trace 116 via an additional weld 406. First insulating layer 111 and second insulating layer 112 provide electrical isolation and mechanical support to conductive traces.

In some examples, conductive trace 115 as well as other traces (if present) may include a surface sublayer or coating for providing a low electrical contact resistance and/or improving corrosion resistance. The surface sublayer may assist with forming electrical interconnections using techniques/materials including, but not limited to, soldering, laser welding, resistance welding, ultrasonic welding, bonding with conductive adhesive, or mechanical pressure. Surface sublayers that may provide a suitable surface for these connection methods include, but are not limited to, tin, lead, zinc, nickel, silver, palladium, platinum, gold, indium, tungsten, molybdenum, chrome, copper, alloys thereof, organic solderability preservative (OSP), or other electrically conductive materials. Furthermore, the surface sublayer may be sputtered, plated, cold-welded, or applied via other means. In some examples, the thickness of the surface sublayer may range from 0.5 micrometers to 10 micrometers or, more specifically, from 0.1 micrometers to 2.5 micrometers. Furthermore, in some examples, the addition of a coating of the OSP on top of the surface sublayer may help prevent the surface sublayer itself from oxidizing over time. The surface sublayer may be used when a base sublayer of conductive trace 115 includes aluminum or its alloys. Without protection, exposed surfaces of aluminum tend to form a native oxide, which is insulating. The oxide readily forms in the presence of oxygen or moisture. To provide a long-term stable surface in this case, the surface sublayer may be resistant to the in-diffusion of oxygen and/or moisture. For example, zinc, silver, tin, copper, nickel, chrome, or gold plating may be used as surface layers on an aluminum-containing base layer.

Alternatively, the surface of conductive trace 115 facing transition pad 455 can be free from any external layers. In some examples, the surface of conductive trace 115 can include a natively forming oxide, e.g., aluminum oxide, copper oxide, and the like.

In some examples, transition pad 455 and conductive trace 115 have thicknesses that differ by less than 50%, less than 30%, or less than 10%. Without being restricted to any particular theory, it is believed that welding components having the same thickness is easier. It should be also noted that using the weldable transition unit 450 allows attaching different types of surface mount devices 460 to flexible interconnect circuit 110 while using the same welding parameters between transition pad 455 and conductive trace 115. Specifically, the same type (e.g., the material, thickness) of transition pad 455 can be used regardless of the device type. However, the thickness of transition pad 455 can be specifically selected to help with welding while supporting the sufficient current ratings through the interface.

In some examples, transition pad 455 comprises a multilayer assembly formed from a layer of the conductive material of the conductive trace 115 and at least one layer of another conductive material selected from the group consisting of nickel, copper, tin, silver, nickel, platinum, gold, and brass. In some examples, the layer of the conductive material of conductive trace 115 and the at least one layer of another conductive material are stacked. In some examples, transition pad 455 may be at least partially coated with a layer of a material comprising tin. The layer of a material comprising tin at least partially coats a different side of transition pad 455 than the side directly interfacing conductive trace 115. The solderability of the layer of another conductive material may depend on the materials' propensity to form surface oxides (at high temperatures associated with the process). Other factors include brittleness (e.g., noble metals), sulfur content (e.g., carbon steel, low alloy steel, zinc, and nickel), surface oxides (e.g., copper, aluminum), and alloying elements that influence the soldering process and may require the use of specialized techniques or materials to achieve successful solder joints.

In some examples, surface mount device 460 is selected from the group consisting of a resistor, a capacitor, a diode, a transistor, an inductor, a transformer, an optoelectronic device, a sensor, a switch, an oscillator, a negative temperature coefficient (NTC) thermistor, an integrated circuit, a printed circuit board (PCB), another flexible interconnect circuit, a power supply, and the like. The number, types, and connections of various surface mount devices 460 to flexible interconnect circuit 110 depends on the application of assembly 400. For example, diodes can be used for rectification, signal modulation, and switching circuits. Transistors can be used in various digital and analog circuits and can include bipolar junction transistors (BJTs) and field-effect transistors (FETs). Integrated circuits (ICs) can operate as logic gates, microprocessors, memory, and specialized circuits. Inductors can be used for energy storage, filtering, and impedance matching. Examples of optoelectronic devices include light-emitting diodes (LEDs), photodiodes, and phototransistors (e.g., to detect light and convert it into electrical signals). Switches can be mechanical or solid-state (e.g., MOSFET switches or relays).

Directly interfacing the transition pad 455 is a stiffener 465 formed from a different material than the transition pad 455. Stiffener 465 interfaces transition pad 455 on a side of the transition pad 455 opposite the flexible interconnect circuit 110. The stiffener 465 comprises an opening 470. Opening 470 is aligned with the surface mount device 460 soldered to the transition pad 455 such that the surface mount device 460 is positioned within the opening 470 when stiffener 465 interfaces transition pad 455. In some examples, stiffener 465 comprises additional opening 471 to accommodate additional surface mount device 462. In some other examples, weldable transition unit 450 comprises more than two devices and stiffener 465 comprises openings to accommodate multiple surface mount devices. Stiffener 465 may be formed from an electrically insulating material such as a polymer resin, including for example, a phenolic resin or a fiberglass reinforced epoxy resin. Stiffener 465 may be formed by, for example, machining or injection molding. Stiffener 465 provides mechanical support for weldable transition unit 450, maintaining the dimensional relationship between, for example, transition pad 455 and surface mount device 460. Undesirable flex of weldable transition unit 450 during handling during, for example, welding of weldable transition unit 450 to flexible interconnect circuit 110, may lead to damage of the electrical connection between surface mount device 460 and transition pad 455. In addition, the weldable transition unit 450 provides mechanical strength during use of assembly 400, for example, attachment of assembly 400 to other devices. The mechanical strength of weldable transition unit 450 desirably allows application of pressure to the assembly 400 for, for example, application of pressure sensitive adhesives. As such, the electrically insulating material of stiffener 465 is chosen to have sufficient strength and thickness to provide suitable resistance to flex. For example, stiffener 465 may have a thickness greater than 0.5 millimeters, greater than 0.9 millimeters, greater than 1.25 millimeters, or even greater than 2 millimeters. In some examples, the stiffener may have a thickness of 1-1.8 millimeters, 1.5-2 millimeters, or even 0.75-3 millimeters.

In some examples, weldable transition unit 450 further comprises a transition adhesive pad 458 positioned between and physically coupling stiffener 465 and transition pad 455. Transition adhesive pad 458 may comprise, for example, a pressure sensitive adhesive, an epoxy, a polyurethane adhesive, or a silicone adhesive. In some examples where weldable transition unit 450 comprises a transition pad 455 and an additional transition pad 456, stiffener 465 is mechanically connected to transition pad 455 by transition adhesive pad 458 and to additional transition pad 456 by an additional transition adhesive pad 459.

A thermally conductive adhesive pad 473 is positioned opposite the stiffener 465 from the transition pad 455. Thermally conductive adhesive pad 473 is thermally connected to surface mount device 460. In some examples, thermally conductive adhesive pad 473 is thermally connected to surface mount device 460 and additional surface mount device 462. In some examples, thermally conductive adhesive pad 473 is in direct mechanical and thermal contact with surface mount device 460. In other examples, thermally conductive adhesive pad 473 is in indirect thermal contact with surface mount device 460. In some examples, thermally conductive adhesive pad 473 may be affixed to form a thermal and mechanical connection of the assembly 400 to a cell in a battery pack. Also shown in FIG. 4A is a thermally conductive adhesive liner 475. In some examples, assembly 400 comprises thermally conductive adhesive liner 475 to protect a second adhesive side of thermally conductive adhesive pad 473 during handling.

Figure 4F:
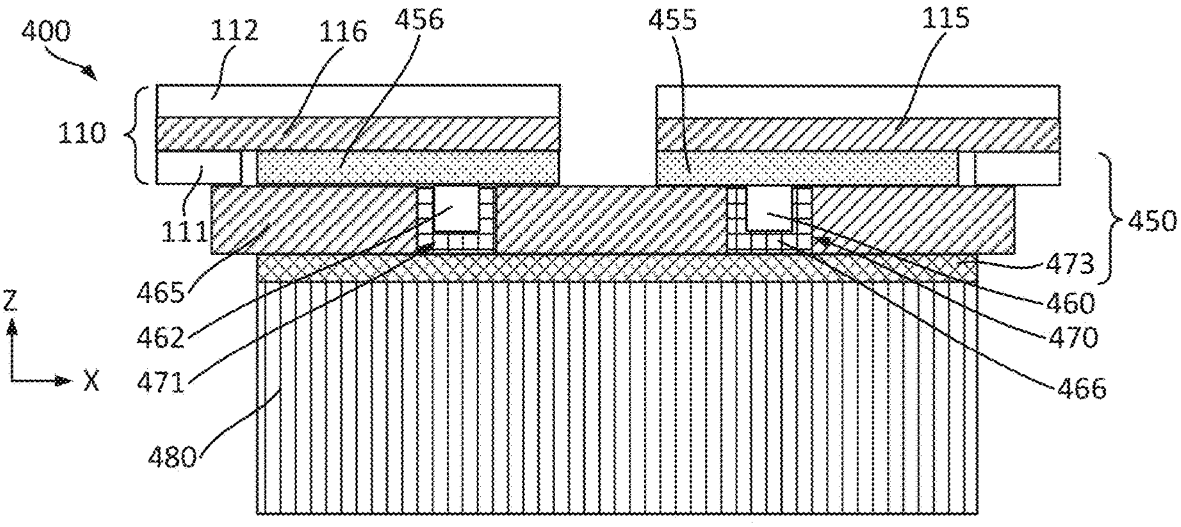
FIG. 4F is a schematic cross-sectional view of an assembly comprising a weldable transition unit and a flexible interconnect circuit affixed to a cell 180 in a battery pack, in accordance with some examples.

In some examples, weldable transition unit 450 includes a thermally conductive filler 466 positioned between surface mount device 460 and thermally conductive adhesive pad 473. Weldable transition unit 450 may comprise a cavity with walls formed by flexible interconnect circuit 110, transition pad 455, opening 470, and thermally conductive adhesive pad 473. This cavity may be partially filled by surface mount device 460. The remaining volume of this cavity may be partially or completely filled by thermally conductive filler 466. Thermally conductive filler 466 may comprise, for example, heat transfer compound, a thermally conductive paste, or a thermally conductive epoxy. When present, thermally conductive filler 466 is in direct thermal contact with both surface mount device 460 and thermally conductive adhesive pad 473. In some examples, surface mount device 460 is a temperature sensor. Specifically, surface mount device 460 may be a negative temperature coefficient (NTC) thermistor. Referring to FIG. 4F, in some examples, thermally conductive adhesive pad 473 may be affixed to a cell 480 in a battery pack. Surface mount device 460 is then in indirect thermal contact with the cell and thereby may provide sensing of the temperature of the cell 480. In some examples, more than one surface mount device is positioned within opening 470 and in thermal contact with thermally conductive filler 466.

Figure 5:
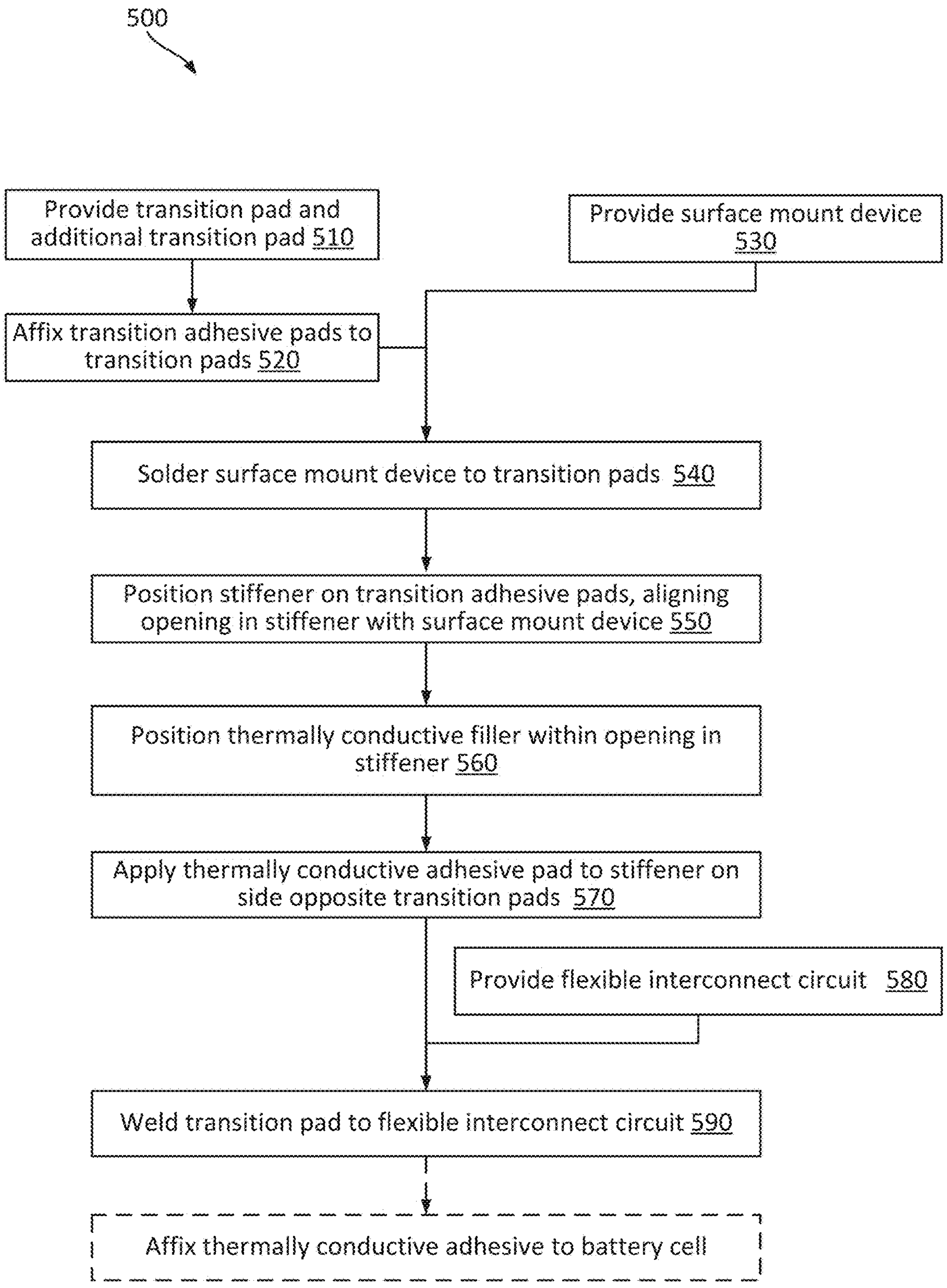
FIG. 5 is a process flowchart corresponding to a method of fabricating an assembly comprising a flexible interconnect circuit, at least one weldable interface unit comprising at least one device connected to the flexible interconnect circuit, in accordance with some examples.

FIG. 5: Examples of Methods for Fabricating Assemblies With Weldable Transition Units FIG. 5 is a process flowchart representing method 500 of fabricating assembly 400 comprising flexible interconnect circuit 110, at least one weldable transition unit 450, and at least one surface mount device 460, in accordance with some examples.

In some examples, method 500 comprises (block 510) providing transition pad 455 and additional transition pad 456, each comprising a conductive material layer. In some examples, the conductive material layers comprise a metal. In some specific examples, the conductive material is aluminum. In some examples, more than two transition pads are provided. In some examples, at least a portion of at least one surface of each of transition pad 455 and additional transition pad 456 is coated with a material comprising tin. Applying a coating of tin in this way may improve solderability for connecting devices to transition pad 455 and additional transition pad 456. Additional aspects of transition pad 455 are described above.

In some examples, method 500 comprises (block 520) affixing transition adhesive pad 458 to transition pad 455 and affixing additional transition adhesive pad 459 to additional transition pad 456. Transition adhesive pad 458 and additional transition adhesive pad 459 may comprise, for example, a pressure sensitive adhesive, an epoxy, a polyurethane adhesive, or a silicone adhesive.

In some examples, method 500 comprises (block 530) providing surface mount device 460. In some examples, surface mount device 460 is selected from the group consisting of a resistor, a capacitor, a diode, a transistor, an inductor, a transformer, an optoelectronic device, a sensor, a switch, an oscillator, a negative temperature coefficient (NTC) thermistor, an integrated circuit, a printed circuit board (PCB), another flexible interconnect circuit, a power supply, and the like. In some examples, an additional surface mount device 462 is also provided. In some further examples, more than two devices are provided.

In some examples, method 500 comprises (block 540) soldering surface mount device 460 to transition pad 455 and additional transition pad 456. During soldering, a surface of surface mount device 460 is held adjacent to a surface of transition pad 455 and another surface of surface mount device 460 is held adjacent to a surface of additional transition pad 456. The temperatures of the surfaces is increased to a soldering temperature at which solder melts. Molten solder coats portions of the surfaces. When cooled, the solder forms a mechanical and electrical connection between the surfaces. In some examples, solder is applied to heated surfaces. In other examples, solder is applied to the surfaces prior to heating. In some examples, additional surface mount device 462 is also soldered to these or other transition pads. In some examples, more than two devices are soldered to transition pads. As shown in FIG. 4A, in some examples, soldering is such that transition pad 455 and additional transition pad 456 share a plane after soldering. Soldering electrically and mechanically connects the surface mount device 460 to both the transition pad 455 and the additional transition pad 456. Soldering may be by reflow soldering. Soldering may heat components including transition pad 455, additional transition pad 456, surface mount device 460, and additional surface mount device 462 to temperatures that exceed safe temperatures for other components of weldable transition unit 450 or other components of assembly 400.

In some examples, method 500 comprises (block 550) positioning stiffener 465 on transition pad 455 and additional transition pad 456. Stiffener 465 comprises opening 470. In some examples, stiffener 465 comprises at least one additional opening 471. Additional aspects of stiffener 465 are provided above. Stiffener 465 is positioned such that surface mount device 460 is positioned in opening 470. Positioning mechanically connects stiffener 465 to transition pad 455 additional transition pad 456 with an adhesive. In some examples, the adhesive is transition adhesive pad 458 and additional transition adhesive pad 459.

In some examples, method 500 comprises (block 560) applying a thermally conductive filler 466 to opening 470. Aspects of thermally conductive filler 466 are detailed above. Thermally conductive filler 466 is applied to opening 470 such that the surface mount device 460 and thermally conductive filler 466 are in thermal contact. Thermally conductive filler 466 may also be applied such that a portion of 265 interfaces the side of opening 470 on the opposite side of stiffener 465 from transition pad 455. In some examples where thermally conductive filler 466 is a thermally conductive epoxy, thermally conductive filler 466 may be fully or partially cured after application. In examples where stiffener 465 comprises more than one opening, thermally conductive filler 466 may be applied to one or more than one opening.

In some examples, method 500 comprises (block 570) applying a thermally conductive adhesive pad 473 to the side of stiffener 465 opposite the transition pad 455. In examples where thermally conductive filler 466 has been applied to opening 470, thermally conductive adhesive pad 473 is applied such that the thermally conductive adhesive pad 473 is in thermal contact with the thermally conductive filler 466. In examples where no 265 has been applied, thermally conductive adhesive pad 473 is applied such that the thermally conductive adhesive pad 473 is in thermal contact with the surface mount device 460. In some examples, thermally conductive adhesive pad 473 is a thermally conductive pressure sensitive adhesive.

In some examples, method 500 comprises (block 580) providing a flexible interconnect circuit 110 comprising a conductive trace 115. In some examples, conductive trace 115 comprises aluminum. Flexible interconnect circuit 110 comprises first insulating layer 111, second insulating layer 112, and conductive trace 115 positioned between first insulating layer 111 and second insulating layer 112. In some examples, flexible interconnect circuit 110 comprises additional conductive trace 116. Conductive trace 115 comprises a conductive material. Other aspects of flexible interconnect circuit 110 are detailed above.

In some examples, method 500 comprises (block 590) welding weldable transition unit 450 to conductive trace 115. The welding forms a weld 405 such that weld 405 mechanically and electrically interconnects the weldable transition unit 450 and the conductive trace 115. In some examples, welding is done by ultrasonic welding. In other examples, welding is done by laser welding. In some examples, welding may be done at a portion of conductive trace 115 where a portion of second insulating layer 112 is removed. Removing a portion of second insulating layer 112 may simplify welding parameters. In other examples, welding may be done without removal of a portion of second insulating layer 112. Not requiring removal of a portion of second insulating layer 112 may simplify welding.

In some examples, method 500 comprises affixing the thermally conductive adhesive pad 473 to a cell 480. For example, cell 480 may be a battery cell of a battery assembly. Affixing thermally conductive adhesive pad 473 to a cell 480 indirectly thermally interconnects the surface mount device 460 with cell 480 via thermally conductive adhesive pad 473 and, if included, thermally conductive filler 466. In some examples, as shown in FIG. 1C, assembly 400 comprises a thermally conductive adhesive liner 475. If assembly 400 comprises thermally conductive adhesive liner 475, thermally conductive adhesive liner 475 may be removed from thermally conductive adhesive pad 473 prior to affixing thermally conductive adhesive pad 473 to cell 480.

Figure 6A:
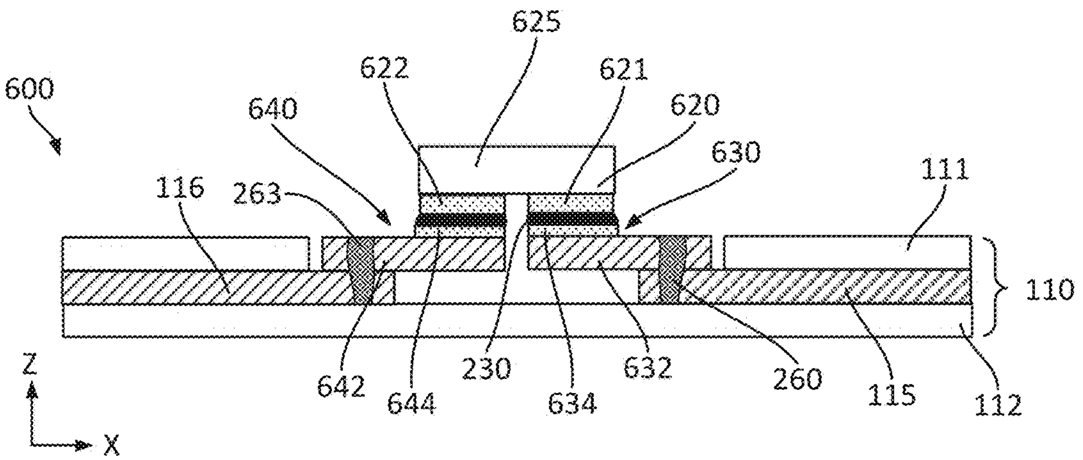
FIGS. 6A and 6B are schematic side cross-sectional and top views of an assembly comprising a flexible interconnect circuit, two interface units, and a device connected to the flexible interconnect circuit by these interface units, in accordance with some examples.
Figure 6B:
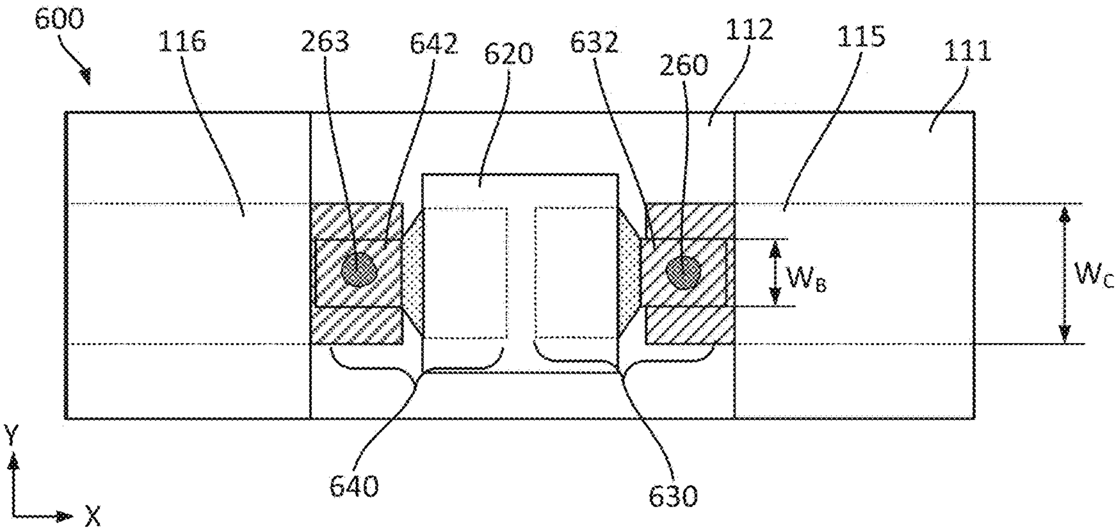
Figure 6C:
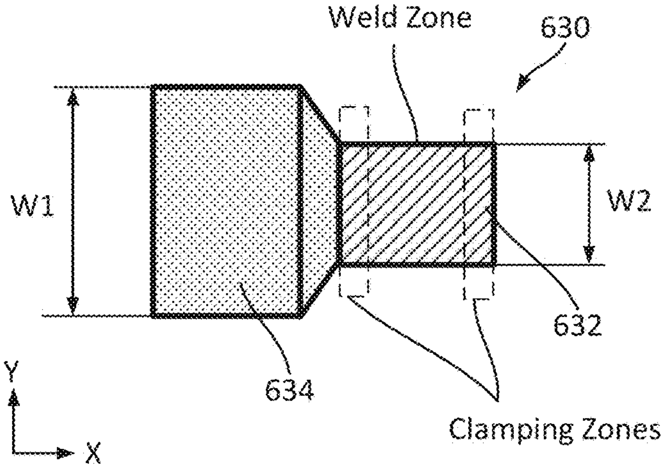
FIG. 6C is a schematic top view of an interface unit illustrating the relative orientations of an interface-unit solderable layer and an interface-unit base, in accordance with some examples.

FIGS. 6A-6C, 7A-7C, 8A-8C, and 9A-9B: Examples of Assemblies With Interface Units FIGS. 6A and 6B are schematic side-cross-sectional and top views of assembly 600 comprising flexible interconnect circuit 110, two interface units (i.e., interface unit 630 and additional interface unit 640), and device 620 connected to flexible interconnect circuit 110 by the interface units, in accordance with some examples. Interface unit 630 and additional interface unit 640 allow using different materials for conductive elements at device 620 and flexible interconnect circuit 110 and to maintain consistent processing parameters when forming the connections between flexible interconnect circuit 110 and the interface units (regardless of the device types). As such, different device types can be integrated into flexible interconnect circuit 110 (to form assembly 600) in a very consistent and efficient manner.

Specifically, flexible interconnect circuit 110 comprising conductive trace 115. In some examples, flexible interconnect circuit 110 comprises additional conductive trace 116. Conductive trace 115 and additional conductive trace 116 can be positioned on the same circuit level (e.g., in the same plane and formed from the same metal foil) or different circuit levels (e.g., when different conductive traces form a stack along the thickness of flexible interconnect circuit 110/the Z-axis). In some examples, conductive trace 115 comprises aluminum. However, forming electrical connections to aluminum can be challenging. Interface unit 630 is used for this purpose.

In some examples, conductive trace 115, as well as other traces (if present), have a uniform thickness throughout the entire circuit boundary. For example, conductive trace 115 as well as other traces can be formed from the same sheet of metal (even when these traces are disjoined). In some examples, all conductive trace 115 as well as other traces (if present) are formed from the same material, e.g., aluminum, copper, or the like. The use of aluminum (instead of copper) may help with lowering the overall circuit weight and also with lowering the minimum achievable fuse current rating. Specifically, aluminum has a higher resistivity and lower melting temperature than copper. As such, forming fusible links in an aluminum conductive layer may allow for more precise control of the fusible parameters (for the same size tolerance). In general, conductive trace 115 may be formed from any conductive material that is sufficiently conductive (e.g., a conductivity being greater than 10^6 S/m or even greater than 10^7 S/m to allow for current flow through the foil with low power loss.

In some examples, conductive trace 115 as well as other traces (if present) may include a surface sublayer or coating for providing a low electrical contact resistance and/or improving corrosion resistance. The surface sublayer may assist with forming electrical interconnections using techniques/materials including, but not limited to, soldering, laser welding, resistance welding, ultrasonic welding, bonding with conductive adhesive, or mechanical pressure. Surface sublayers that may provide a suitable surface for these connection methods include, but are not limited to, tin, lead, zinc, nickel, silver, palladium, platinum, gold, indium, tungsten, molybdenum, chrome, copper, alloys thereof, organic solderability preservative (OSP), or other electrically conductive materials. Furthermore, the surface sublayer may be sputtered, plated, cold-welded, or applied via other means. In some examples, the thickness of the surface sublayer may range from 0.5 micrometers to 10 micrometers or, more specifically, from 0.1 micrometers to 2.5 micrometers. Furthermore, in some examples, the addition of a coating of the OSP on top of the surface sublayer may help prevent the surface sublayer itself from oxidizing over time. The surface sublayer may be used when a base sublayer of conductive trace 115 includes aluminum or its alloys. Without protection, exposed surfaces of aluminum tend to form a native oxide, which is insulating. The oxide readily forms in the presence of oxygen or moisture. To provide a long-term stable surface in this case, the surface sublayer may be resistant to the in-diffusion of oxygen and/or moisture. For example, zinc, silver, tin, copper, nickel, chrome, or gold plating may be used as surface layers on an aluminum-containing base layer.

Alternatively, the surface of conductive trace 115 facing interface unit 630 can be free from any external layers. In some examples, the surface of conductive trace 115 can include a natively forming oxide, e.g., aluminum oxide, copper oxide, and the like. Various protective layers, surface oxides and surface conditioning techniques are further described below with reference to FIGS. 7A-9E.

Interface unit 630 comprises interface-unit solderable layer 634 and interface-unit base 632. Interface-unit solderable layer 634 can be in the form of a clad, e.g., by cladding the interface-unit base 632 onto interface-unit solderable layer 634. The cladding involves bonding dissimilar materials (e.g., using roll bonding, explosive welding, or laser cladding). In some examples, interface-unit base 632 comprises aluminum making it suitable for welding to conductive trace 115. The selection of material for interface-unit solderable layer 634 can be such that this material is capable of forming a solderable connection with device 620 or, more specifically, with contact pad 621 of device 620. In some examples, contact pad 621 comprises copper. As such, the material for interface-unit solderable layer 634 can be copper, brass, and the like.

Referring to FIGS. 6A and 6B, interface-unit base 632 is welded to conductive trace 115 forming weld 260. For example, weld 260 can be a laser weld and an ultrasonic weld. Laser welding employs a concentrated beam for melting and joining two components (e.g., two aluminum components) together. The beam can be very precise, resulting in minimal distortion of the welded components and requiring minimal weld areas. Laser welding can be used for thin conductive traces/interface-unit bases. Ultrasonic welding employs high-frequency waves to heat and bond two components and can be generally faster than laser welding. However, ultrasonic welding requires a larger footprint and can introduce more distortion in the welded material compared to laser welding.

Referring to FIGS. 6A and 6B, contact pad 621 is soldered to interface-unit solderable layer 634. Specifically, solder patch 230 is disposed between contact pad 621 and interface-unit solderable layer 634. Solder patch 230 mechanically and electrically interconnects contact pad 621 and interface-unit solderable layer 634. Some examples of materials used for solder patch 230 include, but are not limited to, lead (Pb), tin (Sn), silver (Ag), bismuth (Bi), antimony (Sb), indium (In), and cadmium (Cd).

Referring to FIGS. 6A and 6B, interface-unit base 632 and conductive trace 115 directly interface each other (e.g., interface-unit solderable layer 634 does not protrude between interface-unit base 632 and conductive trace 115). Furthermore, the interface between interface-unit base 632 and conductive trace 115 can be substantially free from any protective layers, such as organic solderability preservatives (OSP).

Referring to FIG. 6A, in some examples, interface-unit solderable layer 634 is positioned away from weld 260. As such, when weld 260 is formed, interface-unit solderable layer 634 does not interfere with the welding process. Alternatively, interface-unit solderable layer 634 overlaps with weld 260 (or at least with the footprint of the weld, e.g., when weld 260 does not extend all the way to the surface of interface-unit base 632 facing away from conductive trace 115). For example, the entire side of interface unit 630 can be covered with interface-unit solderable layer 634. However, it should be noted that even in this example, interface-unit solderable layer 634 is positioned away from the interface between conductive trace 115 and interface-unit base 632. This feature may help with forming the weld 260, e.g., when the same or similar materials are used for conductive trace 115 and interface-unit base 632.

Figure 7A:
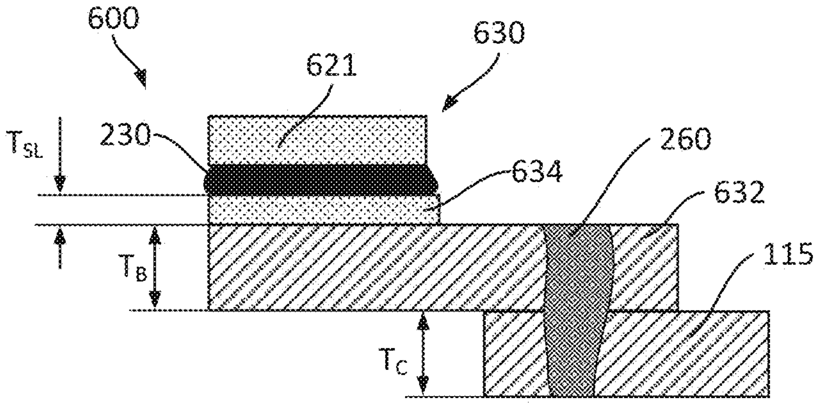
FIGS. 7A-7C are schematic side cross-sectional views of different examples of a sub-assembly comprising a flexible interconnect circuit and an interface unit.

Referring to FIGS. 6A and 7A, in some examples, interface-unit solderable layer 634 at least partially extends over the surface of interface-unit base 632 facing away from conductive trace 115. In other words, interface-unit base 632 is positioned between interface-unit solderable layer 634 and conductive trace 115. As such, interface-unit solderable layer 634 is positioned away from the interface between conductive trace 115 and interface-unit base 632.

Figure 7B:
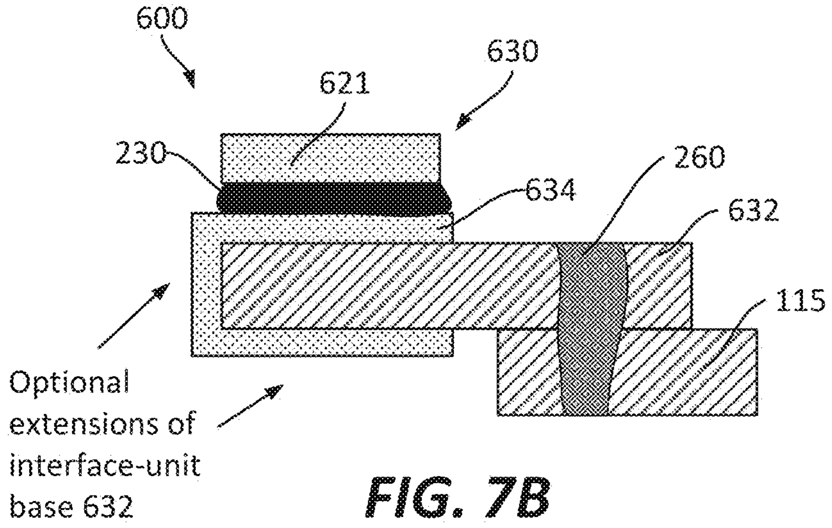
Figure 7C:
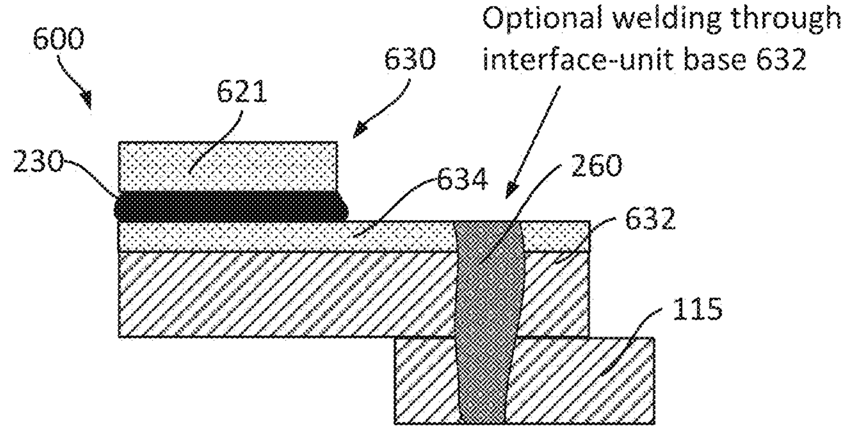

Referring to FIG. 7A, in some examples, interface-unit solderable layer 634 is positioned only one the surface of interface-unit base 632 that faces away from conductive trace 115. In other words, the surface of interface-unit base 632 that faces conductive trace 115 is free from interface-unit solderable layer 634. FIG. 7B illustrates another example in which a portion of interface-unit solderable layer 634 extends to the surface of interface-unit base 632 that faces conductive trace 115. However, this portion of interface-unit solderable layer 634 does not extend to the interface between interface-unit base 632 and conductive trace 115 thereby ensuring the weld strength. FIG. 7C illustrates yet another example in which a portion of interface-unit solderable layer 634 extends to weld 260 and can be a part of weld 260, at the surface of interface-unit base 632 that faces away from conductive trace 115. It should be noted that in this example, interface-unit solderable layer 634 still does not extend to the interface between interface-unit base 632 and conductive trace 115 thereby ensuring the weld strength.

In some examples, interface-unit base 632 and conductive trace 115 have thicknesses that differ by less than 50%, less than 30%, or less than 10%. Without being restricted to any particular theory, it is believed that welding components having the same thickness is easier. It should be also noted that using the interface unit 630 allows attaching different types of devices 620 to flexible interconnect circuit 110 while using the same welding parameters between interface-unit base 632 and conductive trace 115. Specifically, the same type (e.g., the material, thickness) of interface-unit base 632 can be used regardless of the device type. However, the thickness of interface-unit base 632 can be specifically selected to help with welding while supporting the sufficient current ratings through the interface.

In some examples, interface-unit solderable layer 634 comprises one or more materials selected from the group consisting of nickel, copper, tin, silver, nickel, platinum, gold, and brass. The solderability may depend on the materials' propensity to form surface oxides (at high temperatures associated with the process). Other factors include brittleness (e.g., noble metals), sulfur content (e.g., carbon steel, low alloy steel, zinc, and nickel), surface oxides (e.g., copper, aluminum), and alloying elements that influence the soldering process and may require the use of specialized techniques or materials to achieve successful solder joints.

In some examples, device 620 is selected from the group consisting of a resistor, a capacitor, a diode, a transistor, an inductor, a transformer, an optoelectronic device, a sensor, a switch, an oscillator, a negative temperature coefficient (NTC) thermistor, an integrated circuit, a printed circuit board (PCB), another flexible interconnect circuit, a power supply, and the like. The number, types, and connections of various devices 620 to flexible interconnect circuit 110 depends on the application of assembly 600. For example, diodes can be used for rectification, signal modulation, and switching circuits. Transistors can be used in various digital and analog circuits and can include bipolar junction transistors (BJTs) and field-effect transistors (FETs). Integrated circuits (ICs) can operate as logic gates, microprocessors, memory, and specialized circuits. Inductors can be used for energy storage, filtering, and impedance matching. Examples of optoelectronic devices include light-emitting diodes (LEDs), photodiodes, and phototransistors (e.g., to detect light and convert it into electrical signals). Switches can be mechanical or solid-state (e.g., MOSFET switches or relays).

Referring to FIG. 6A, in some examples, flexible interconnect circuit 110 further comprises first insulating layer 111 and second insulating layer 112 such that conductive trace 115 at least partially extends between and adhered to first insulating layer 111 and second insulating layer 112. In more specific examples as shown in FIG. 6A, the portion of conductive trace 115, forming weld 260 with interface-unit base 632, extends past first insulating layer 111 and overlaps with second insulating layer 112. However, other examples are within the scope. For example, the portion of conductive trace 115, forming weld 260 with interface-unit base 632, may extend past second insulating layer 112.

First insulating layer 111 and second insulating layer 112 provide electrical isolation and mechanical support to conductive traces. In some examples, first insulating layer 111 and second insulating layer 112 may initially be processed in a sheet or roll form and may subsequently be laminated to the conductive layer using, for example, adhesive material. First insulating layer 111 and second insulating layer 112 may include (or be formed from) polyimide (PI), polyethylene naphthalate (PEN), polyethylene terephthalate (PET), polymethyl methacrylate (PMMA), ethyl vinyl acetate (EVA), polyethylene (PE), polyvinyl fluoride (PVF), polyamide (PA), and/or polyvinyl butyral (PVB). Additional aspects (e.g., thicknesses) of first insulating layer 111 and second insulating layer 112 are described below.

The thickness of one or both first insulating layer 111 and second insulating layer 112 may be between 1 micrometer and 500 micrometers or, more specifically, between 10 micrometers and 125 micrometers. In some examples, each of first insulating layer 111 and second insulating layer 112 includes an adhesive sublayer facing conductive traces, e.g., for lamination to conductive traces and also to each other. These adhesive sublayers may be also used for directly laminating first insulating layer 111 and second insulating layer 112 (beyond the conductive layer boundaries), e.g., for edge sealing of flexible interconnect circuit 110. In some examples, the surface of first insulating layer 111 and/or second insulating layer 112 (e.g., the surface facing away from conductive traces) comprises an adhesive sublayer for bonding this insulating layer to an external structure (e.g., a supporting panel). First insulating layer 111 and second insulating layer 112 provide the electrical isolation and mechanical support to conductive traces. Additional aspects (e.g., materials) of first insulating layer 111 and second insulating layer 112 are described elsewhere in this document. Furthermore, additional aspects of conductive trace 115 or, more generally, conductive traces formed by these traces are described elsewhere in this document (e.g., uniform thickness, materials, surface sublayers).

Returning to FIG. 6A, in some examples, assembly 600 further comprises additional conductive trace 116 comprising aluminum. Device 620 comprises additional contact pad 622 comprising copper. Assembly 600 comprises additional interface unit 640 comprising additional interface-unit solderable layer 644 and additional interface-unit base 642 comprising aluminum and welded to additional conductive trace 116 forming an additional weld 263. Assembly 600 comprises additional solder patch 231 disposed between additional contact pad 622 and additional interface-unit solderable layer 644 such that additional solder patch 231 mechanically and electrically interconnects additional contact pad 622 and additional interface-unit solderable layer 644.

In some examples, additional conductive trace 116 is a part of flexible interconnect circuit 110. For example, flexible interconnect circuit 110 further comprises first insulating layer 111 and second insulating layer 112 such that conductive trace 115 at least partially extends between and adhered to first insulating layer 111 and second insulating layer 112. Additional conductive trace 116 at least partially extends between and adhered to first insulating layer 111 and second insulating layer 112.

In some examples, first insulating layer 111 has first-insulator-layer opening exposing a portion of conductive trace 115, forming weld 260 with interface-unit base 632, and a portion of additional conductive trace 116, forming additional weld 263 with additional interface-unit base 642. Interface-unit base 632 and additional interface-unit base 642 at least partially extend into first-insulator-layer opening. In further examples, second insulating layer 112 has a second-insulator-layer opening at least partially exposing interface-unit base 632 and additional interface-unit base 642. For example, the portion of second insulating layer 112 overlapping with first-insulator-layer opening is continuous and opening-free.

Figure 8A:
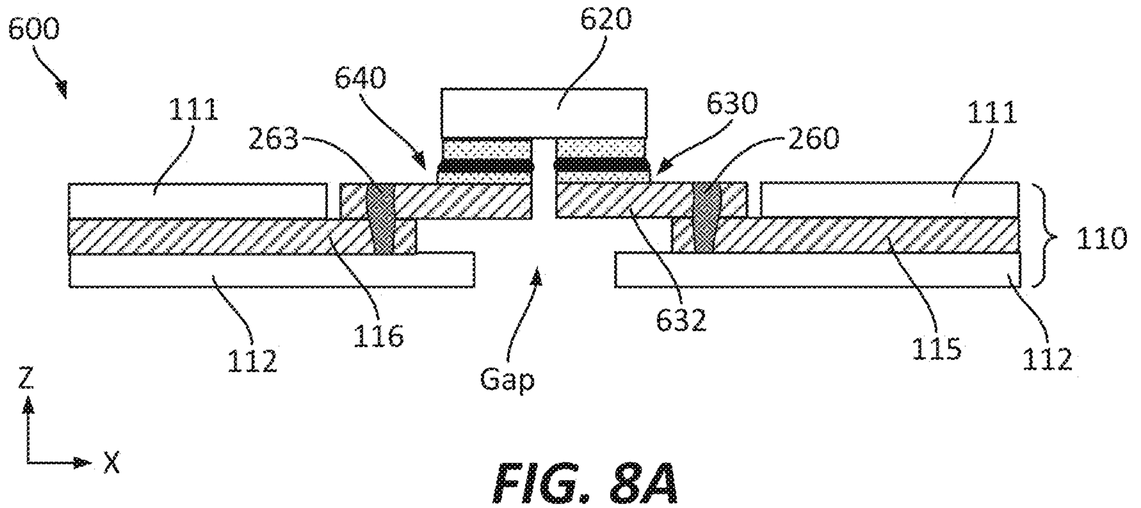
FIGS. 8A-8C are schematic side cross-sectional views of different examples of an assembly comprising a flexible interconnect circuit, two interface units, and a device connected to the flexible interconnect circuit by the interface units, illustrating different arrangements of the insulating layers of the flexible interconnect circuit.

Referring to FIG. 6A, in some examples, in some examples, first insulating layer 111 and/or second insulating layer 112 support other traces, e.g., additional conductive trace 116. These traces may be similar to conductive trace 115, e.g., formed from the same metal sheet. For example, second insulating layer 112 can extend under interface unit 630, additional interface unit 640, and device 620 and bridge conductive trace 115 with additional conductive trace 116, providing support to conductive trace 115 and additional conductive trace 116 relative to each other. FIG. 8A illustrates another example, in which second insulating layer 112 has a gap under device 620. This gap can be used, e.g., to access interface-unit base 632 and additional interface-unit base 642 (while soldering to device 620). Alternatively, soldering of interface unit 630 and additional interface unit 640 to device 620 is performed before welding interface unit 630 and additional interface unit 640 to flexible interconnect circuit 110 (as described below with reference to FIGS. 11A-11E). In some examples, device 620 is connected to two separate flexible interconnect circuits such that device 620 interconnects two separate flexible interconnect circuits.

Figure 8B:
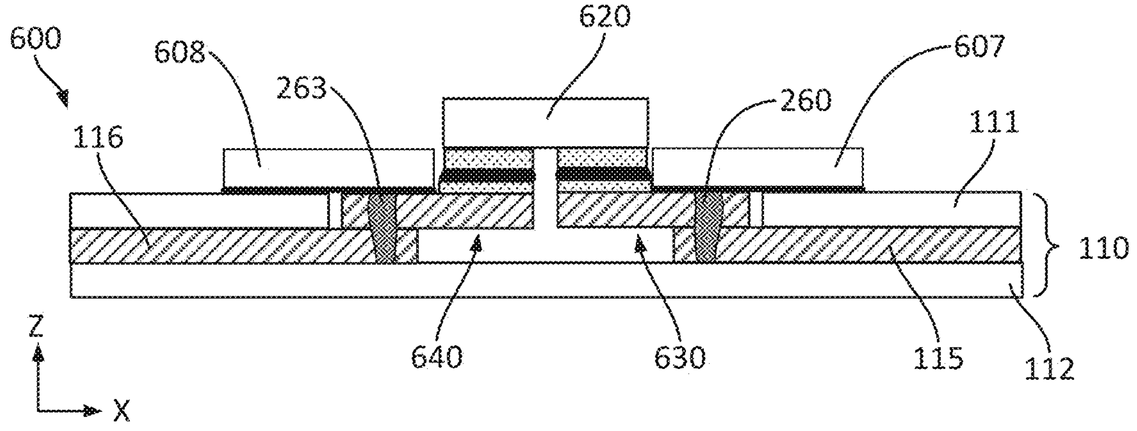

Referring to FIG. 8B, in some examples, assembly 600 comprises an insulating cover 607 that extends over weld 260 and a portion of interface unit 630 and conductive trace 115 extending between first insulating layer 111 and device 620. For example, insulating cover 607 can extend to device 620. In some examples, insulating cover 607 extends over a portion of first insulating layer 111 as shown in FIG. 8B. In some examples, assembly 600 comprises an additional insulating cover 608 that extends over additional weld 263 and a portion of additional interface unit 640 and additional conductive trace 116 extending between first insulating layer 111 and device 620.

Figure 8C:
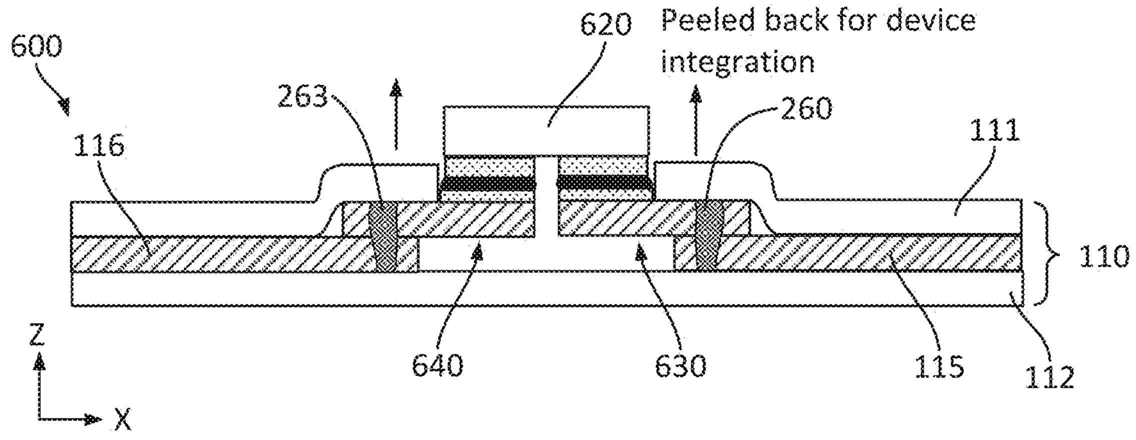
Figure 9A:
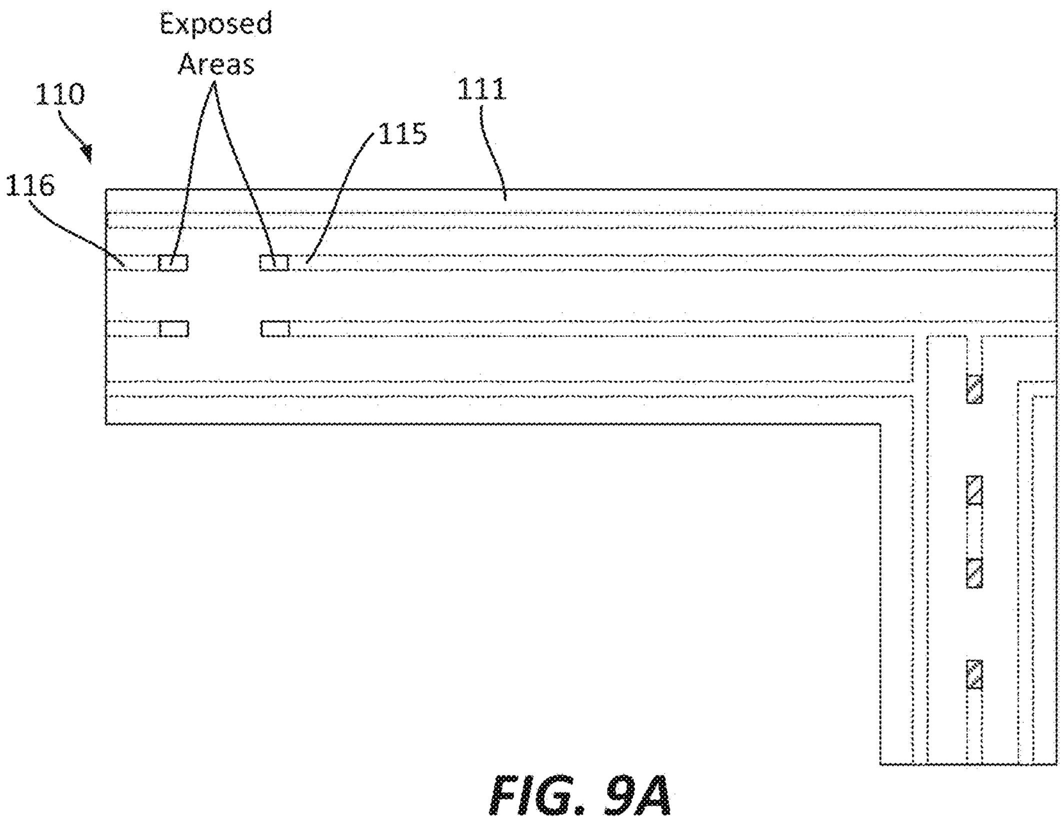
FIG. 9A is a schematic top view of a flexible interconnect circuit before connecting any interface units and devices to the flexible interconnect circuit, in accordance with some examples.
Figure 9B:
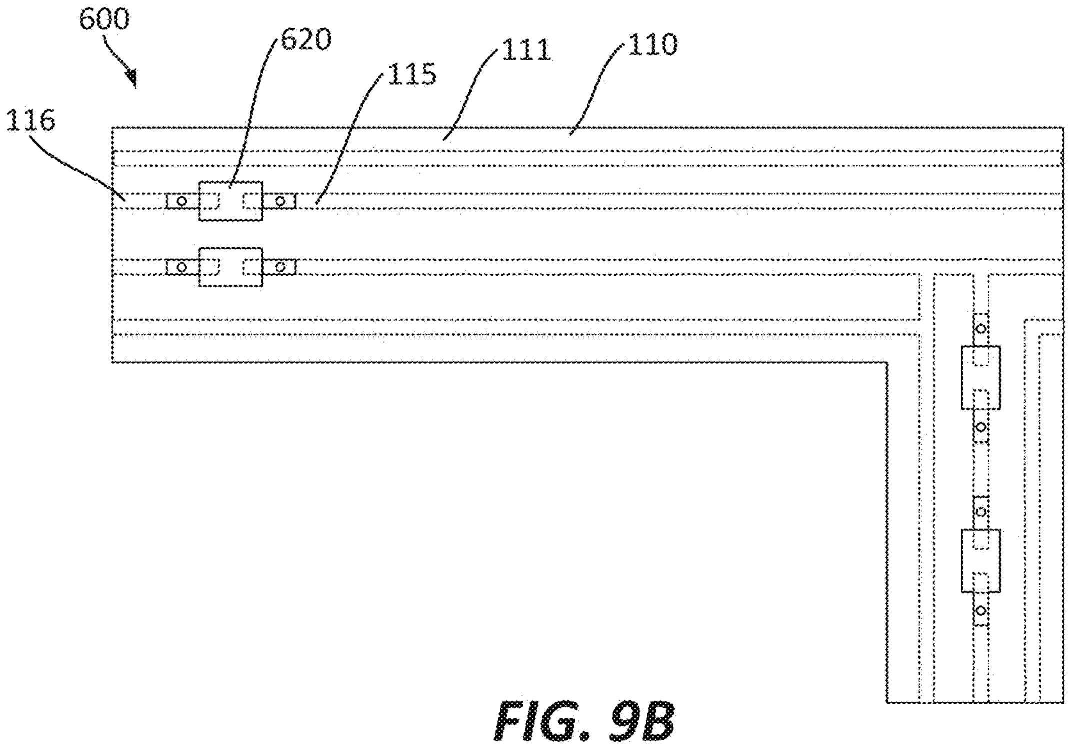
FIG. 9B is a schematic top view of an assembly formed from the flexible interconnect circuit in FIG. 9A after connecting several interface units and devices to the flexible interconnect circuit, in accordance with some examples.

Referring to FIG. 8C, in some examples, first insulating layer 111 takes a function of an insulating cover (described above with reference to FIG. 8B). For example, first insulating layer 111 extends over weld 260 and a portion of interface unit 630 to device 620. In more specific examples, first insulating layer 111 also extends over additional weld 263 and a portion of additional interface unit 640 to device 620.

In some examples, the width (W1) of interface-unit solderable layer 634 is greater than the width (W2) of interface-unit base 632. For example, W1 can be between 1-4 millimeters, while W2 can be 0.5-3 millimeters. In general, the size of interface-unit solderable layer 634 can be such that connections to different types of device 620 are possible. For example, different device types may have different connection pads. Interface-unit base 632 can be conceptually divided into clamping zones and a weld zone, positioned in between the clamping zones.

FIGS. 10 and FIGS. 11A-11E: Examples of Fabricating Methods

Figure 10:
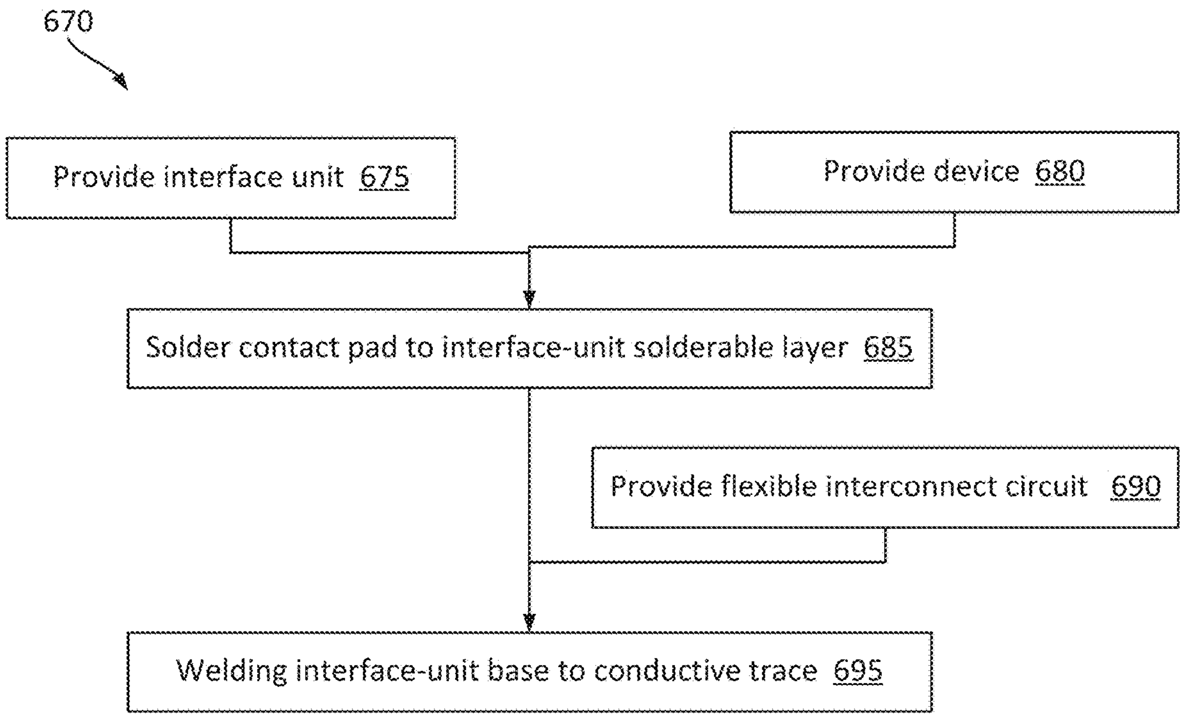
FIG. 10 is a process flowchart corresponding to a method of fabricating an assembly comprising a flexible interconnect circuit, at least one interface unit, and at least one device connected to the flexible interconnect circuit, in accordance with some examples.
Figure 11A:
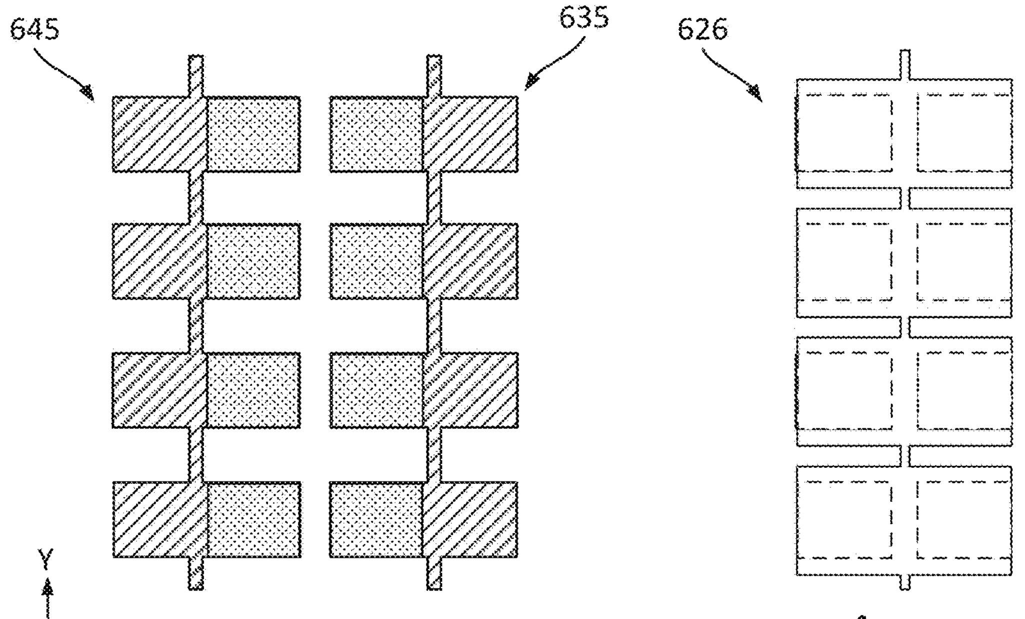
FIGS. 11A-11E are schematic views of different stages during the fabrication of an assembly in accordance with the method of FIG. 10, in accordance with some examples.
Figure 11B:
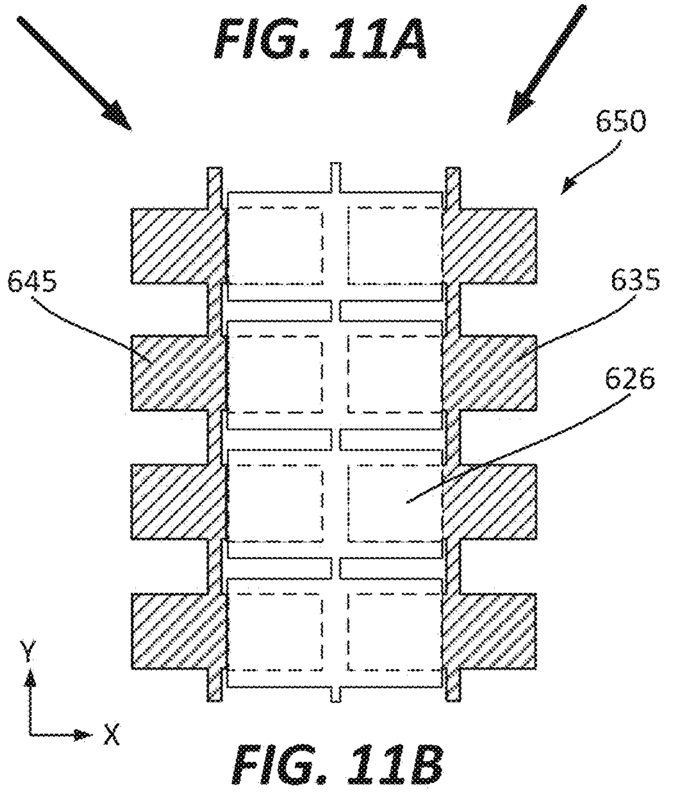
Figure 11C:
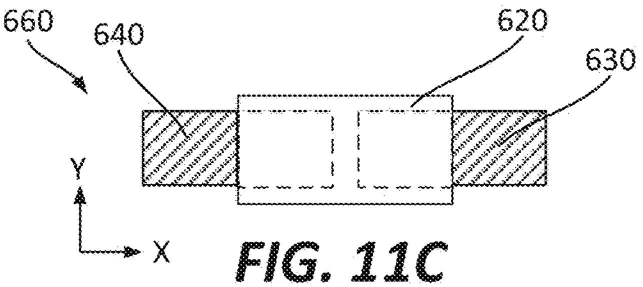
Figure 11D:
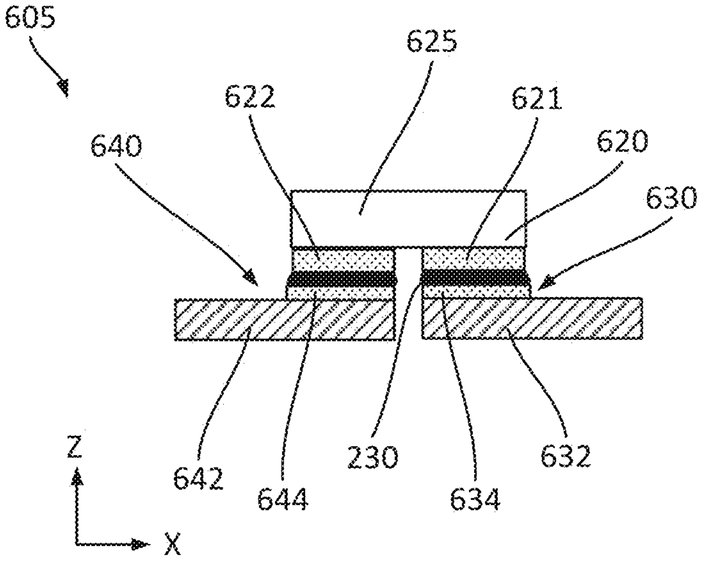
Figure 11E:
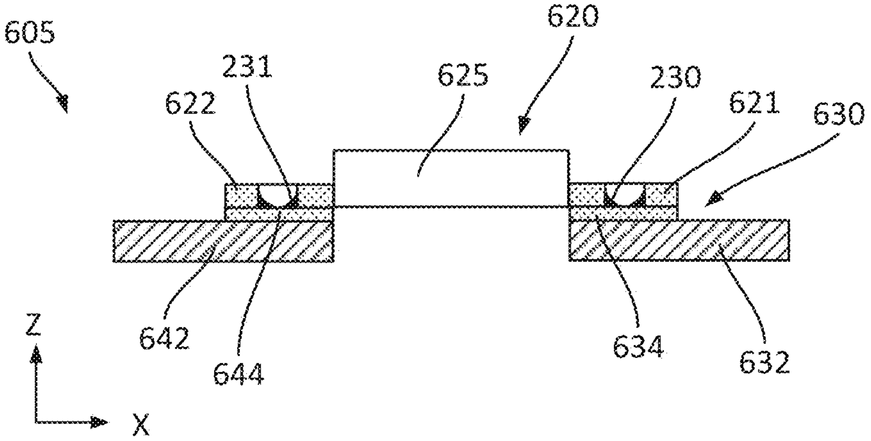

FIG. 10 is a process flowchart representing method 670 of fabricating assembly 605 comprising flexible interconnect circuit 110, at least one interface unit, and at least one device devices connected to the flexible interconnect circuit, in accordance with some examples. FIGS. 11A-11E are schematic views of different stages during the fabrication of assembly 605 in accordance with the method of FIG. 10, in accordance with some examples.

In some examples, method 670 comprises (block 675) providing interface unit 630 comprising interface-unit solderable layer 634 and interface-unit base 632. Specifically, interface-unit base 632 comprises aluminum. Additional aspects of interface unit 630 are described above. In some examples, interface unit 630 is provided as a part of interface-unit assembly 635, e.g., as shown in FIG. 8A. For example, interface unit 630 can have temporary connections to one or two other interface units arranged in a row. Integrating interface unit 630 into interface-unit assembly 635 simplifies the handling of all interface units. In some examples, interface-unit assembly 635 is provided together with additional interface-unit assembly 645, e.g., as shown in FIG. 6A.

In some examples, method 670 comprises (block 680) providing device 620 comprising device base 625 and contact pad 621. Contact pad 621 can comprise copper. Additional aspects of device 620 are described above. In some examples, device 620 is provided as a part of device assembly 626, e.g., as shown in FIG. 8A. For example, device 620 can have temporary connections to one or two other devices arranged in a row. Integrating the device 620 into device assembly 626 simplifies the handling of all devices.

In some examples, method 670 comprises (block 685) soldering contact pad 621 to interface-unit solderable layer 634. As noted above, this operation forms solder patch 230 such that solder patch 230 mechanically and electrically interconnects contact pad 621 and interface-unit solderable layer 634. In some examples, this soldering operation is performed on interface-unit assembly 635, additional interface-unit assembly 645, and device assembly 626 forming interface unit-device assembly 650, e.g., as shown in FIG. 6A.

As noted above, interface unit 630 can be provided as a part of interface-unit assembly 635 comprising additional interface units temporarily interconnected with each other. Device 620 is provided as a part of device assembly 626 comprising additional devices temporarily interconnected with each other. In these examples, contact pad 621 is soldered to interface-unit solderable layer 634 while interface unit 630 is part of interface-unit assembly 635, and device 620 is part of device assembly 626 forming an interface-unit-device assembly 650. Furthermore, in these examples, method 670 further comprises before welded interface-unit base 632 to conductive trace 115, separating an interface-unit-device unit 660 from interface-unit-device assembly 650, wherein interface-unit-device unit 660 comprises a single count of device 620.

In some examples, method 670 comprises (block 690) providing flexible interconnect circuit 110 comprising conductive trace 115 and, optionally, additional conductive trace 116. Conductive trace 115 (and additional conductive trace 116, if present) comprises aluminum. Additional aspects of flexible interconnect circuit 110 are described above.

In some examples, method 670 comprises (block 695) welding interface-unit base 632 to conductive trace 115 forming weld 260 such that weld 260 mechanically and electrically interconnects interface-unit base 632 and conductive trace 115.

In some examples, soldering contact pad 621 to interface-unit solderable layer 634 is performed before welding interface-unit base 632 to conductive trace 115.

In some examples, assembly 605 further comprises additional conductive trace 116, device 620 comprises additional contact pad 622, while assembly 605 comprises additional interface unit 640. In these examples, method 670 further comprises soldering additional contact pad 622 to additional interface-unit solderable layer 644 of additional interface unit 640 thereby forming additional solder patch 231 such that additional solder patch 231 mechanically and electrically interconnects additional contact pad 622 and additional interface-unit solderable layer 644. Method 670 further comprises welding additional interface-unit base 642 to additional conductive trace 116 forming an additional weld 263 such that additional weld 263 mechanically and electrically interconnects additional interface-unit base 642 and additional conductive trace 116.

Figure 12A:
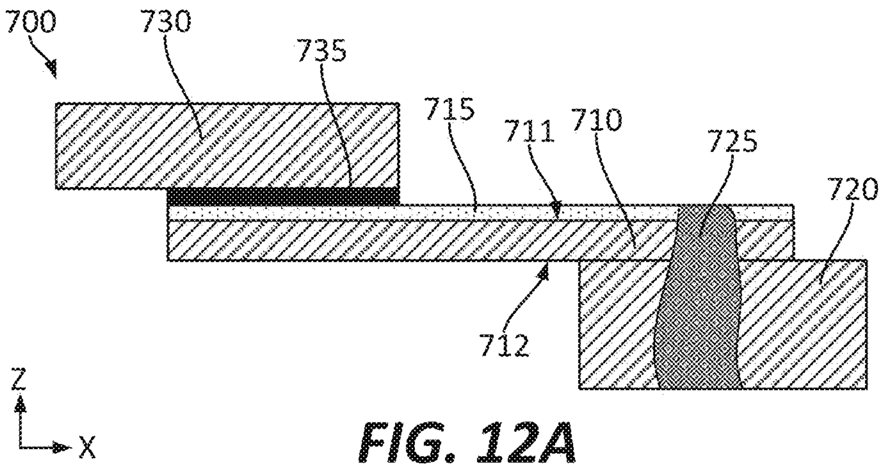
FIGS. 12A and 12B are a schematic side cross-sectional view and a front view of an assembly comprising a conductive element, with a protective layer covering at least one side of the conductive element, welded to another conductive element such that the protective layer is positioned away from the interface between these two conductive layers.
Figure 12B:
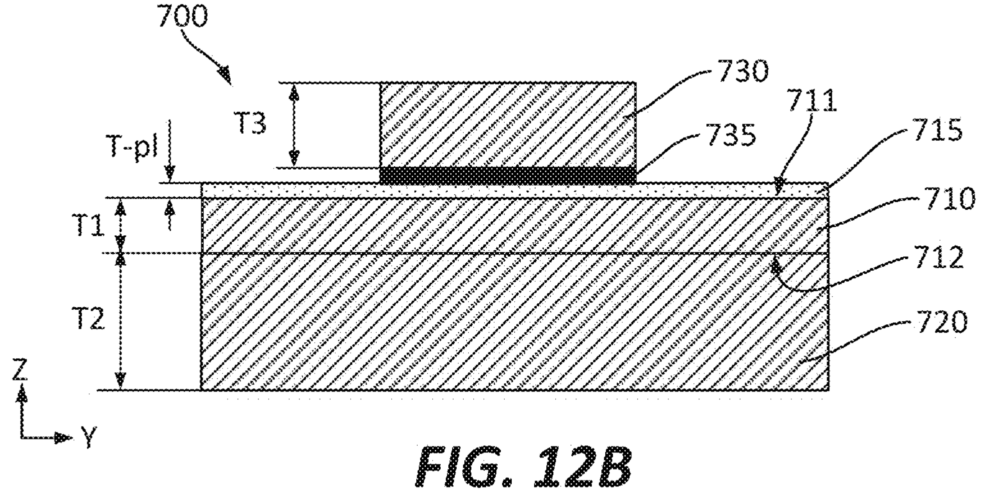
Figure 12C:
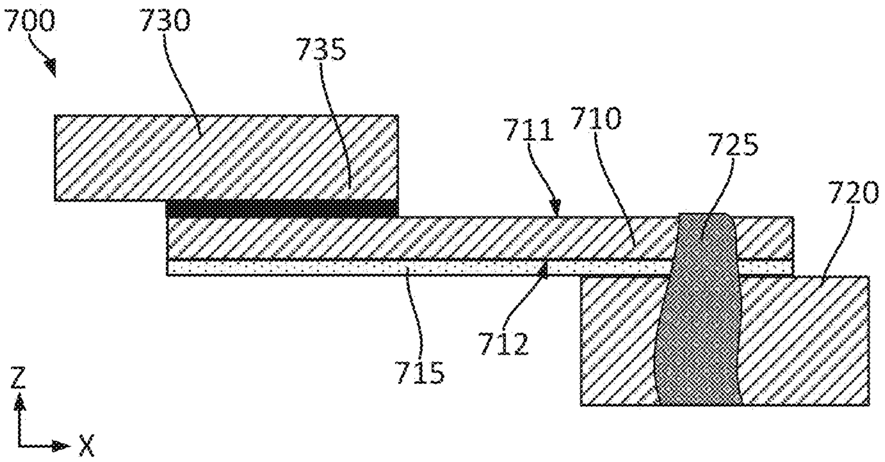
FIG. 12C is a schematic side cross-sectional view of another example of an assembly comprising a conductive element welded to another conductive element such that the protective layer is a part of the welded interface between these two conductive layers.

FIGS. 12A-12C: Example of Assemblies With Protective Layers Over Conductive Elements FIGS. 12A-12C are schematic cross-sectional views of assembly 700 comprising three interconnected conductive elements, i.e., first conductive element 710, second conductive element 720, and additional conductive component 730. Additional conductive component 730 is optional and may be also referred to as a third conductive layer.

First conductive element 710 comprises first surface 711 and second surface 712 opposite of first surface 711. First surface 711 and second surface 712 define the thickness of first conductive element 710. Some thickness aspects are described above and below. First surface 711 has a different surface roughness than second surface 712. In some examples, second surface 712 has a higher surface roughness than first surface 711, e.g., at least twice rougher based on the Ra scale, at least 5 times rougher, or even at least 10 times rougher. As further described below, second surface 712 interfaces second conductive element 720 with weld 725 formed between these conductive elements. This weld 725 protrudes through second surface 712 of first conductive element 710. A higher surface roughness can assist with forming this weld.

In some examples, a higher surface roughness of second surface 712 is achieved by processing first conductive element 710, e.g., while treating the second surface 712 after pattering of first conductive element 710. Various treatment techniques are described below. It should be noted that first conductive element 710 can be formed from copper or, more specifically, from copper foil and various types of copper foils are within the scope, e.g., rolled copper foil, and electroplated copper foil. The rolled copper foil has a different grain structure and smoother surface than the electroplated copper foil. Copper foils are typically covered with organic solderability preservatives (OSP) to reduce surface oxidation and maintain solderability. Treating the second surface 712 (e.g., the deburring process used for the removal of edge burs after patterning rolled copper foils) changes the surface properties in such a way that weldability/solderability is improved relative to the OSP-coated foil. At the same time, it has been found that an OSP layer can actually help with the ultrasonic welding process (e.g., to aluminum battery current collectors). As such, first conductive element 710 can be arranged such that the deburred surface faces the soldering locations, while the OSP-covered surface faces the ultrasonic welding locations. The reverse configuration described below is also within the scope.

Without being restricted to any particular theory, it is believed that removal or at least thinning of the OSP from first conductive element 710 can lead to better welding. At the same time, the absence of OSP on the other side could lead to better soldering surrounding laser cut lines put bulk copper into compression, and lead to better tensile strength.

Referring to FIGS. 12A-12B, in some examples, second surface 712 is substantially free from any surface coatings (e.g., cladding, organic solderability preservatives). It should be noted that second surface 712 interfaces second conductive element 720 and forms a welded interface with second conductive element 720. As such, in these examples, protective layer 715 (if one is present) is positioned from this welded interface. Alternatively and with reference to FIG. 12C, in some examples, first surface 711 is substantially free from any surface coatings (e.g., cladding, organic solderability preservatives), while second surface 712 is covered with protective layer 715. In these examples, protective layer 715 becomes a part of the welded interface. Surprisingly, the presence of the protective layer 715 on the second surface 712 improves the ultrasonic welding of the first conductive element 710 with the second conductive element 720. In some further examples, first surface 711 also has a higher surface roughness than second surface 712. In these examples, it is easier to form robust solder joints between a first conductive element 710 and a additional conductive component 730 when the first surface 711 is rougher than second surface 712 and is substantially free of any surface coatings than when the first surface 711 has a protective coating and a smoother surface than the second surface 712. This is surprising, given that surface coatings, e.g. organic solderability preservatives, are designed to maintain good solderability of copper surfaces.

Regardless of which surface of first conductive element 710 is free from protective layer 715, the other surface covered with protective layer 715. In some examples, first conductive element 710 can be initially provided with protective layers 715 on both sides, with one protective layer 715 later removed during the treatment of this surface (e.g., first surface 711 or second surface 712). For example, first conductive element 710 can have protective layer 715 on first surface 711 and another similar coating on second surface 712. As further described below, second surface 712 (or first surface 711) may be treated thereby removing any surface coatings previously provided on this surface. In some examples, first conductive element 710 is initially provided (e.g., before patterning) with only protective layer 715 on first surface 711, while second surface 712 is exposed (e.g., before patterning). In these examples, treating the second surface 712 after pattering of first conductive element 710 may be used to modify second surface 712, e.g., to increase the surface roughness. In other examples, In some examples, first conductive element 710 is initially provided (e.g., before patterning) with only protective layer 715 on second surface 712, while first surface 711 is exposed (e.g., before patterning).

Protective layer 715 can be a part of first conductive element 710 or, more specifically, can be disposed on at least a portion of first surface 711 of first conductive element 710. Various examples of protective layer 715 are within the scope, e.g., organic solderability preservative (OSP).

Second conductive element 720 directly interfaces and welded to second surface 712 of first conductive element 710 forming weld 725. The interface between second conductive element 720 and first conductive element 710 is substantially free from other components, such as other protective layers, clads, and so on. For example, the interface can be made from bulk materials of the two layers (e.g., bulk metals of second conductive element 720 and first conductive element 710). It should be noted that the surface portion of these layers may have native metal oxides, such as copper oxides and aluminum oxides. However, unlike the externally deposited layer (such as protective layers and clads), these native oxides are very thin due to the self-limiting nature of these oxides. For example, an aluminum oxide layer is rapidly formed on any aluminum metal surface exposed to air with a self-terminating thickness of about 1-2 nanometers. Similarly, nickel and tin oxides are self-limiting, while copper oxide forms very slowly. For comparison, the thickness of protective layer 715 (e.g., OSP can be between 100-1,000 nanometers.

In some examples, first conductive element 710 is thinner than second conductive element 720 (e.g., T1<T2). For example, first conductive element 710 has a thickness (T1) of between 35 micrometers and 125 micrometers or, more specifically, between 50 micrometers and 100 micrometers. In the same or other examples, second conductive element 720 has a thickness (T2) of between 300 micrometers and 700 micrometers or, more specifically, between 400 micrometers and 600 micrometers. For example, first conductive element 710 is operable as a voltage-sense harness, while second conductive element 720 is operable as a battery-module busbar.

In some examples, first conductive element 710 and second conductive element 720 are formed from different materials. For example, first conductive element 710 may comprise copper aluminum, while second conductive element 720 may comprise aluminum. Alternatively, first conductive element 710 and second conductive element 720 can be formed from the same material.

In some examples, weld 725 is formed between second conductive element 720 and first conductive element 710 using ultrasonic welding or laser welding.

Additional conductive component 730 soldered to first surface 711 of first conductive element 710. For example, solder patch 735 is positioned between and forms an interface between first conductive element 710 and additional conductive components 730. In some examples, additional conductive component 730 is operable as a passthrough contact.

Figure 13A:
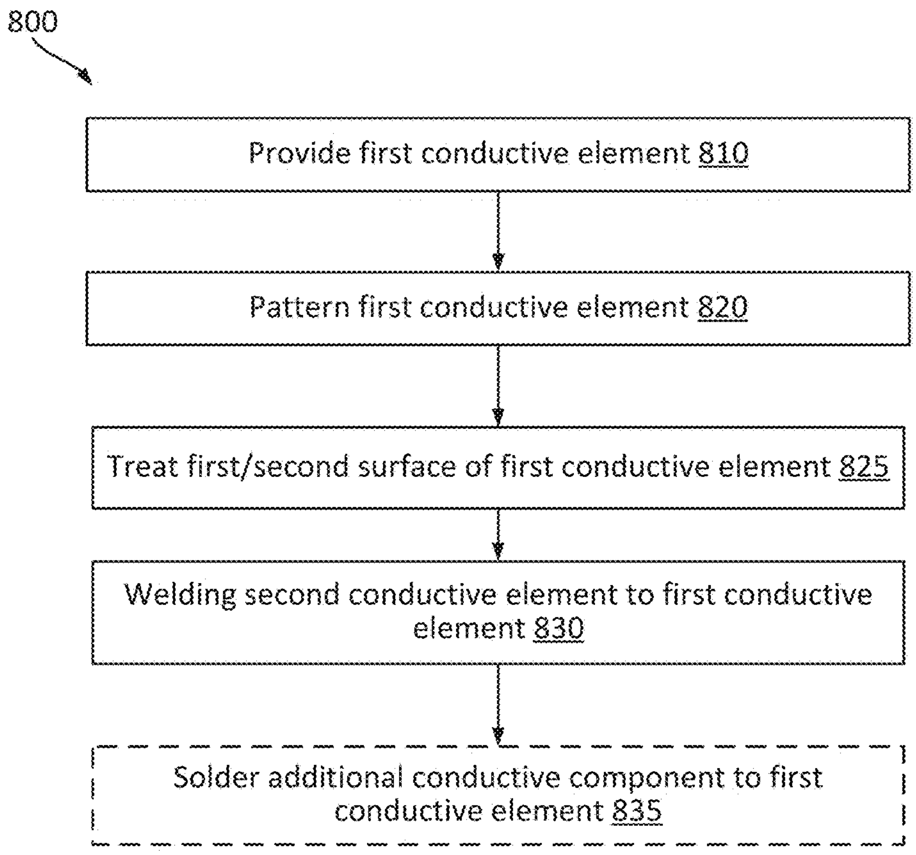
FIG. 13A is a process flowchart corresponding to a method of fabricating an assembly comprising a flexible interconnect circuit having a conductive element, with a protective layer covering at least one side of the conductive element, welded to another conductive element.

FIGS. 13A-13B and 14A-14E: Examples of Methods of Forming Assemblies With Protective Layers FIG. 13A is a process flowchart representing method 800 of fabricating assembly 700 comprising a flexible interconnect circuit having a conductive element, with a protective layer covering at least one side of the conductive element, welded to another conductive element.

FIGS. 14A-14E are schematic views of different stages during the fabrication of assembly 700 in accordance with the method of FIG. 13A, in accordance with some examples.

Figure 14A:
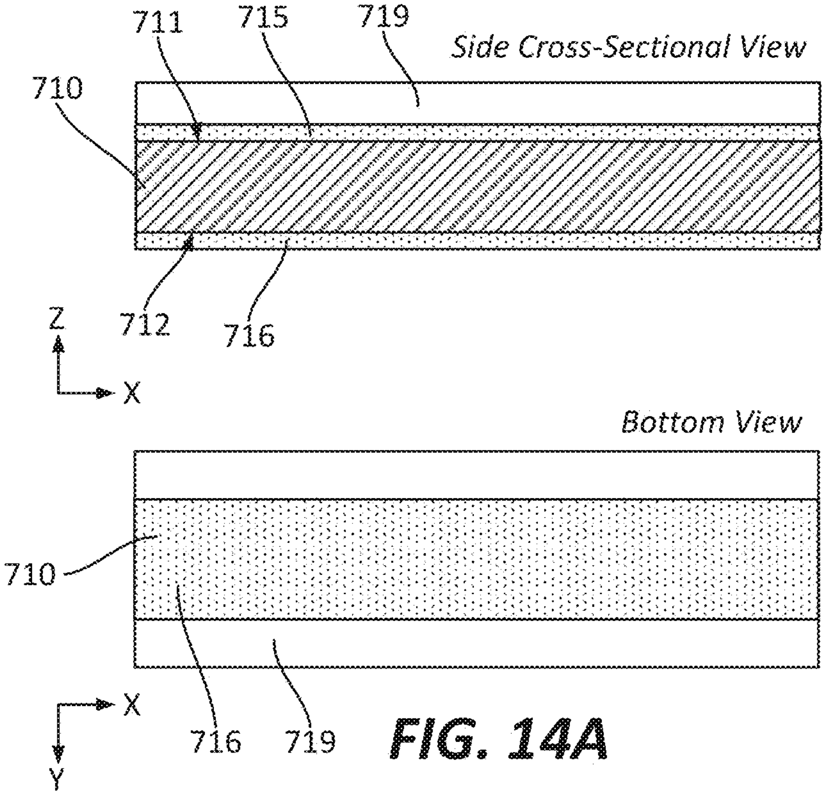
Figure 14B:
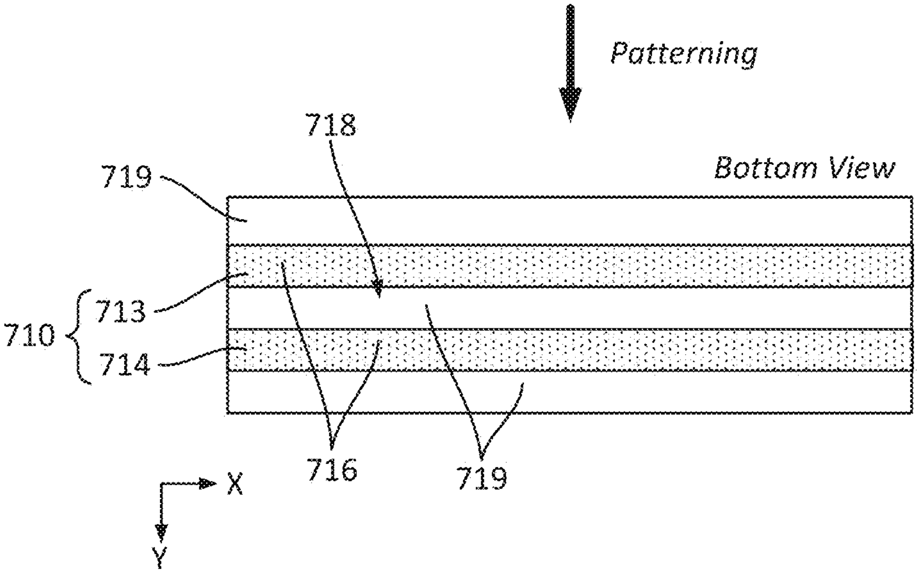
Figure 14E:
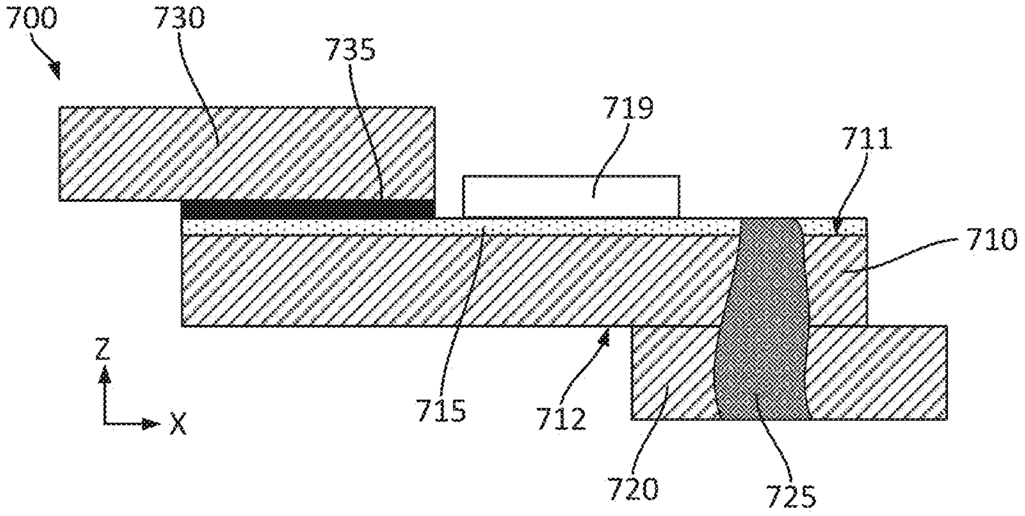

In some examples, method 800 commences with (block 810) providing first conductive element 710, comprising first surface 711 and second surface 712 opposite of first surface 711. First surface 711 is covered by protective layer 715. In some examples, second surface 712 is covered by additional protective layer 716. Furthermore, first conductive element 710 can be laminated support layer 719, which is used to support different parts of first conductive element 710 during and after patterning. FIG. 14A illustrates a side cross-sectional view of a stack comprising additional protective layer 716, first conductive element 710, protective layer 715, and support layer 719. FIG. 14B illustrates a bottom view of the stack in FIG. 14A showing support layer 719 and additional protective layer 716, with first conductive element 710 positioned under additional protective layer 716.

In some examples, one or more portions of protective layer 715 remain uncovered by support layer 719. These portions may be then used to form connections to first conductive element 710, through protective layer 715 as further described below.

Method 800 proceeds with (block 820) patterning first conductive element 710 thereby forming first conductive trace 713 and second conductive trace 714 separated by gap 718 from each other, e.g., as schematically shown in FIG. 14B. Support layer 719 can be used to provide support to first conductive trace 713 and second conductive trace 714 relative to each other (and exposed within gap 718). Specifically, support layer 719 spans gap 718 and faces first surface 711. Protective layer 715 and is positioned between support layer 719 and each of first conductive trace 713 and second conductive trace 714.

At this stage, first conductive trace 713 and second conductive trace 714 can be covered by additional protective layer 716. Additional protective layer 716 can be similar to protective layer 715, e.g., have the same thickness and/or composition.

In some examples, patterning first conductive element 710 is performed using a laser. However, other patterning techniques (e.g., stamping, etching) are also within the scope. Some of these patterning techniques may leave undesirable residues (e.g., burs) that need to be removed to reduce the risk of shorting in the circuit.

Method 800 proceeds with (block 825) treating second surface 712 such that additional protective layer 716 is removed from second surface 712 while treating second surface 712. After this operation, second surface 712 is exposed and not covered e.g., as schematically shown in FIG. 14C. Support layer 719 continues to provide support to first conductive trace 713 and second conductive trace 714 relative to each other during this and later operation.

In some examples, after treating second surface 712, first surface 711 has a different surface roughness than second surface 712. As noted above, second surface 712 may have a higher surface roughness than first surface 711. Various aspects of the surface roughness are described above with reference to FIGS. 12A-12C.

In some examples, treating second surface 712 comprises removing burs from gap 718, first conductive trace 713, second conductive trace 714. These burs can be formed during the patterning of first conductive element 710. In more specific examples, removing burs is performed using mechanical polishing.

In other examples, method 800 proceeds with treating first surface 711 such that a protective layer is removed from first surface 711 while treating first surface 711 (while protective layer 715 remains in second surface 712). After this operation, first surface 711 is exposed and not covered. In more specific examples, after treating first surface 711, first surface 711 has a different surface roughness than second surface 712. For example, second surface 712 may have a lower surface roughness than first surface 711. Various aspects of the surface roughness are described above with reference to FIGS. 12A-12C. In some examples, treating first surface 711 comprises removing burs from gap 718, first conductive trace 713, second conductive trace 714. These burs can be formed during the patterning of first conductive element 710. In more specific examples, removing burs is performed using mechanical polishing.

Method 800 proceeds with (block 830) welding second conductive element 720 to second surface 712 of first conductive element 710 thereby forming weld 725. In some examples, the interface between second conductive element 720 and first conductive element 710 is substantially free from other components.

In some examples, welding second conductive element 720 to first conductive element 710 is performed using ultrasonic welding. As stated above, first conductive element 710 can comprise copper, while second conductive element 720 comprises copper.

Figure 13B:
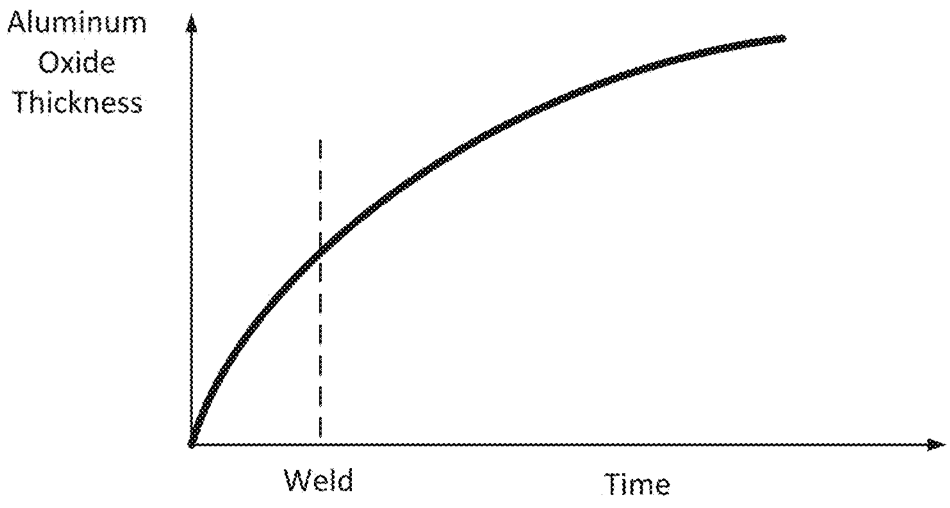
FIG. 13B is a schematic plot of the aluminum oxide thickness as a function of time, illustrating the oxidation rate and the formation of the aluminum oxide layer on the surface of the freshly-polished aluminum structure.

In some examples, welding second conductive element 720 to first conductive element 710 is performed within a set period of time after treating second surface 712, e.g., to reduce the excessive oxide formation on second surface 712, e.g., as schematically shown in FIG. 13B.

In some examples, method 800 further comprises (block 835) soldering additional conductive component 730 to first surface 711 of first conductive element 710 thereby forming solder patch 735 between first conductive element 710 and additional conductive components 730. Specifically, during this soldering operation, solder patch 735 is formed over the protective layer 715 that is partially removed at an interface between solder patch 735 and first conductive element 710.

CONCLUSION

In the foregoing specification, various techniques and mechanisms may have been described in singular form for clarity. However, it should be noted that some embodiments include multiple iterations of a technique or multiple instantiations of a mechanism unless otherwise noted. For example, a system uses a processor in a variety of contexts but can use multiple processors while remaining within the scope of the present disclosure unless otherwise noted. Similarly, various techniques and mechanisms may have been described as including a connection between two entities. However, a connection does not necessarily mean a direct, unimpeded connection, as a variety of other entities (e.g., bridges, controllers, gateways, etc.) may reside between the two entities.

The invention claimed is:

1. An assembly comprising:

a flexible interconnect circuit defining a plane and comprising a conductive trace comprising a conductive material;

a weldable transition unit welded to the conductive trace, forming a weld, and comprising a transition pad;

a surface mount device electronically and mechanically coupled with the transition pad; and a stiffener formed from a different material than the transition pad and directly interfacing the transition pad and comprising an opening aligned with the surface mount device.

2. The assembly of claim 1, wherein:

the transition pad has a thickness in a direction perpendicular to the plane of the flexible interconnect circuit, the conductive trace has a thickness in the direction perpendicular to the plane of the flexible interconnect circuit, and the thickness of the transition pad and the thickness of the conductive trace differ by less than 30%.

3. The assembly of claim 1, wherein the stiffener has a thickness in a direction perpendicular to the plane of the flexible interconnect circuit of 1.5-2 millimeters.

4. The assembly of claim 1, wherein the transition pad and the conductive trace have a substantially similar composition.

5. The assembly of claim 1, wherein the conductive material of the conductive trace is aluminum.

6. The assembly of claim 1, wherein the transition pad directly interfaces the conductive trace.

7. The assembly of claim 1, further comprising a thermally conductive adhesive pad interfacing the stiffener such that the stiffener is positioned between the thermally conductive adhesive pad and the transition pad.

8. The assembly of claim 7, wherein the thermally conductive adhesive pad comprises a thermally conductive pressure sensitive adhesive.

9. The assembly of claim 7, further comprising a thermally conductive filler positioned within the opening and thermally coupled with both the thermally conductive adhesive pad and the surface mount device.

10. The assembly of claim 9, wherein the thermally conductive filler comprises a thermally conductive epoxy.

11. The assembly of claim 1, further comprising a transition adhesive pad positioned between and physically coupling the transition pad and the stiffener.

12. The assembly of claim 1, wherein the transition pad comprises two layers formed from different conductive materials selected from the group consisting of aluminum, nickel, copper, tin, silver, nickel, platinum, gold, and brass.

13. The assembly of claim 1, wherein the transition pad is at least partially coated with a layer comprising tin.

14. The assembly of claim 1, wherein the surface mount device is selected from the group consisting of a resistor, a capacitor, a diode, a transistor, an inductor, a transformer, an optoelectronic device, a sensor, a switch, an oscillator, a negative temperature coefficient (NTC) thermistor, an integrated circuit, a printed circuit board (PCB), another flexible interconnect circuit, and a power supply.

15. The assembly of claim 1, wherein the weld is one of a laser weld and an ultrasonic weld.

16. The assembly of claim 1, wherein:

the flexible interconnect circuit further comprises a first insulating layer and a second insulating layer such that the conductive trace at least partially extends between and adheres to the first insulating layer and the second insulating layer, and a portion of the conductive trace, forming the weld, extends past the first insulating layer and overlaps with the second insulating layer.

17. The assembly of claim 16, wherein:

the assembly further comprises an additional conductive trace comprising a conductive material;

the weldable transition unit further comprises an additional surface mount device and an additional transition pad comprising a conductive material and affixed to the flexible interconnect circuit and electronically coupled with the additional conductive trace via an additional weld; and the stiffener further comprises an additional opening aligned with the additional surface mount device.

18. The assembly of claim 17, wherein the additional transition pad is at least partially coated with a layer of a material comprising tin.

* * * * *